United States Patent
Hirshberg

(10) Patent No.: US 10,133,479 B2
(45) Date of Patent: Nov. 20, 2018

(54) SYSTEM AND METHOD FOR TEXT ENTRY

(71) Applicant: David Hirshberg, Haifa (IL)

(72) Inventor: David Hirshberg, Haifa (IL)

( * ) Notice: Subject to any disclaimer, the term of this patent is extended or adjusted under 35 U.S.C. 154(b) by 638 days.

(21) Appl. No.: 13/952,621

(22) Filed: Aug. 27, 2013

(65) Prior Publication Data

US 2013/0339895 A1   Dec. 19, 2013

Related U.S. Application Data

(63) Continuation-in-part of application No. 11/774,578, filed on Jul. 7, 2007, now Pat. No. 8,521,927.

(51) Int. Cl.
  *G06F 13/12*  (2006.01)
  *G06F 3/0488*  (2013.01)
  *G06F 3/023*  (2006.01)
  *H03K 17/96*  (2006.01)

(52) U.S. Cl.
  CPC ........ *G06F 3/04886* (2013.01); *G06F 3/0237* (2013.01); *H03K 17/96* (2013.01)

(58) Field of Classification Search
  None
  See application file for complete search history.

(56) References Cited

U.S. PATENT DOCUMENTS

| | | | | |
|---|---|---|---|---|
| 6,597,345 B2* | 7/2003 | Hirshberg | ...... | 345/168 |
| 2002/0183100 A1* | 12/2002 | Parker | ...... | 455/566 |
| 2004/0104896 A1* | 6/2004 | Suraqui | ...... | 345/168 |
| 2007/0182595 A1* | 8/2007 | Ghasabian | ...... | 341/22 |
| 2010/0060585 A1* | 3/2010 | Chiu | ...... | 345/168 |

* cited by examiner

*Primary Examiner* — Henry Tsai
*Assistant Examiner* — Dean Phan

(57) ABSTRACT

A method of text entry for an electronic device comprising: receiving a sequence of keystrokes performed over a plurality of keys of a keyboard of the electronic device, wherein a single keystroke enters a single letter location in a word, and wherein the set of the keystrokes comprises a first set of keystrokes for single letter entries that select single letter in an alphabet and a second set of keystrokes for letter group entries that selects a group of possible letters from the alphabet for a single letter location; creating list of possible words the user intends to enter based on a priori database of words by searching in the word database words having letters that match the sequence of letter entries; and displaying the list of possible words to a user, receiving the user selection of a desired word and providing the selected word for further processing.

23 Claims, 10 Drawing Sheets

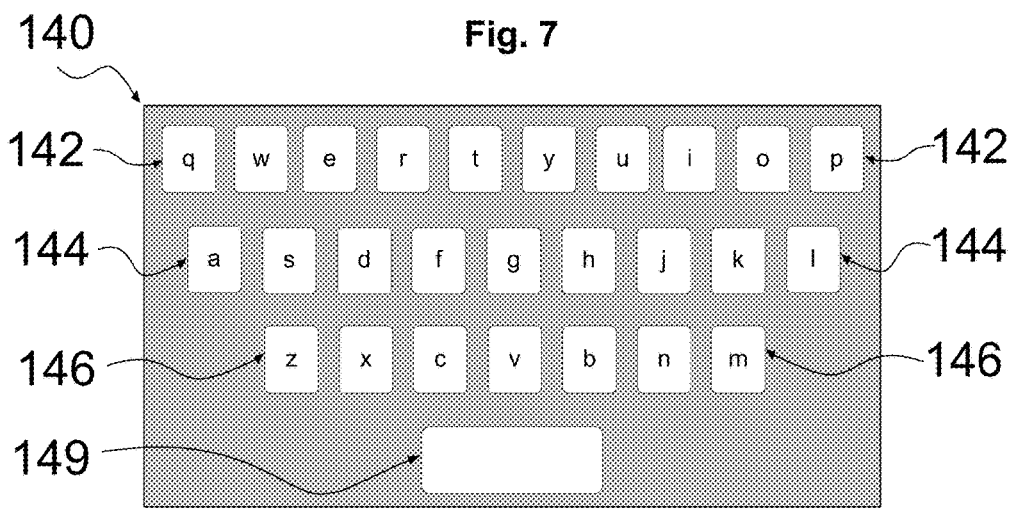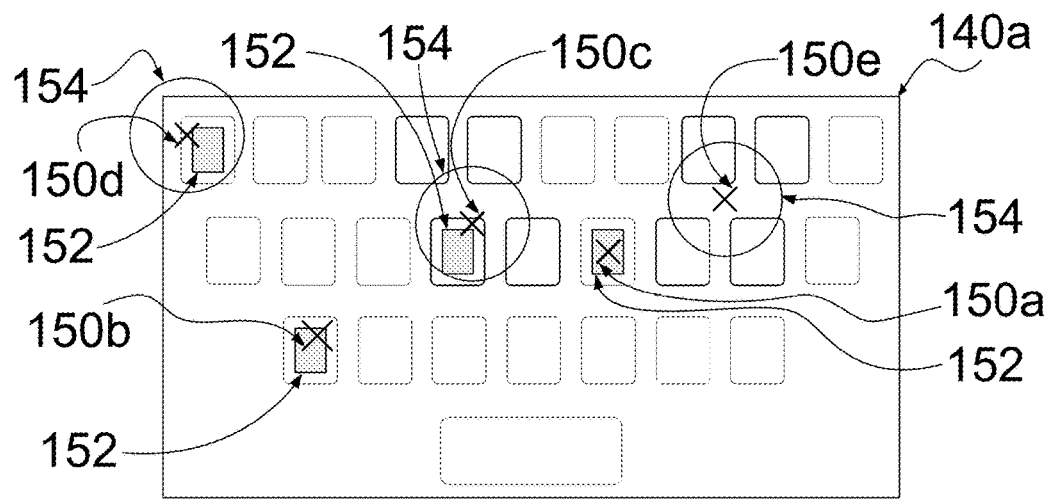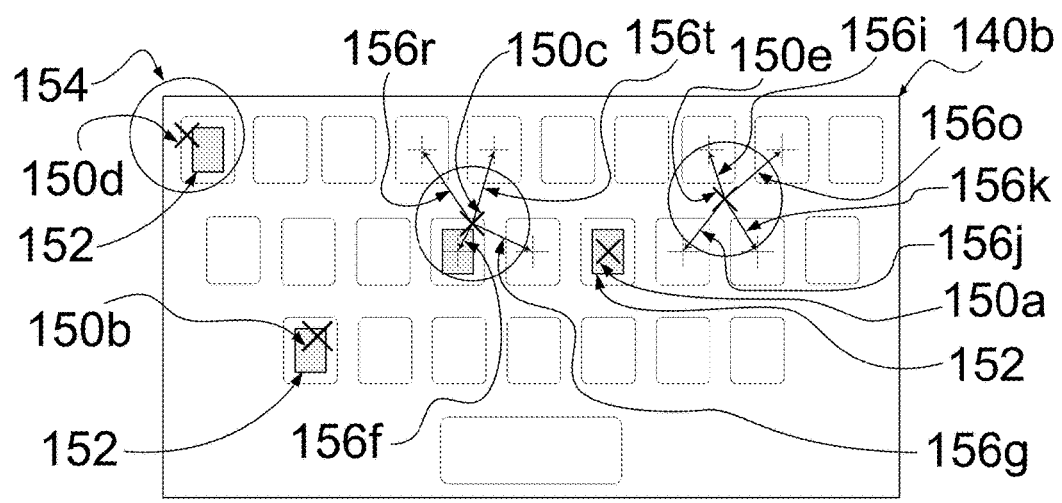

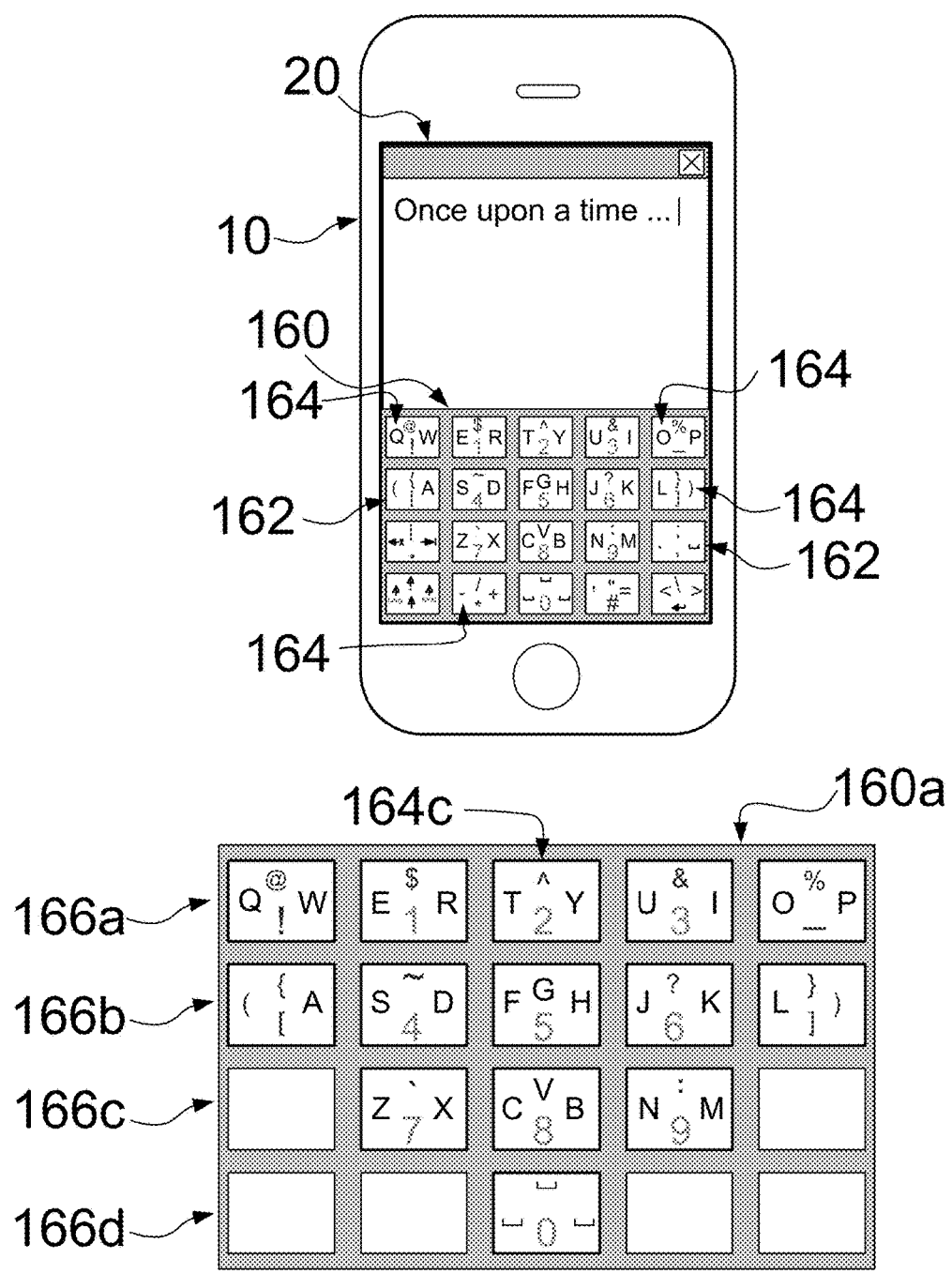

SYSTEM AND METHOD FOR TEXT ENTRY

CROSS REFERENCE TO RELATED APPLICATION

This application is a continuation-in-part of application U.S. Ser. No. 11/774,578, filed on Jul. 7, 2007, which is hereby incorporated by reference in its entirety.

FIELD AND BACKGROUND OF THE INVENTION

Text entry is one of the vital issues for smart phones as well as for other compact hand held devices.

Many methods have been suggested in recent years. Among the most popular ones are methods that reduce the number of keys by grouping several letters together on a single key and use a prediction or disambiguating system to generate the desired text. Since fewer keys are needed, smaller keypad size or larger key size is obtainable. Less finger movements are needed hence typing speed is potentially increased. However, if the user desires to write a word that is not in the device's dictionary database, or if more than one valid word exists for a sequence of letter entries, a considerable degradation in typing speed and comfort occurs.

In U.S. Pat. No. 5,818,437 entitled "reduced keyboard disambiguating computer", Grover, et al., a 3 by 4 numeric keypad is presented where each key is associated with 3 or 4 letters. In U.S. Pat. No. 5,847,697 entitled "Single-handed keyboard having keys with multiple characters and character ambiguity resolution logic", Sugimoto, a half size QWERTY keyboard, with two letters associated to most of the keys, is presented. Similar arrangements and various types of keys arrangements and text prediction or disambiguation processing exists in prior art.

Ways to present the word list to the user and receiving the user selection of the desired word, including word completion, are available in prior art too.

None of the prior art combines predictive text entry methods with simple full keyboard text entry to provide unified text entry system.

SUMMARY OF THE INVENTION

The present invention, in some embodiments thereof, relates to user interface and, more particularly, but not exclusively, to text entry.

According to an aspect of some embodiments of the present invention there is provided a method of text entry for an electronic device, comprising:
(a) receiving a sequence of keystrokes performed over a plurality of keys of a keyboard of the electronic device, wherein a single keystroke enters a single letter location in a word, and wherein the set of the keystrokes comprises a first set of keystrokes for single letter entries that select single letter in an alphabet and a second set of keystrokes for letter group entries that selects a group of possible letters from the alphabet for a single letter location entry;
(b) creating list of possible words the user intends to enter based on a priori database of words by searching in the word database words having letters that match the sequence of letter entries; and
(c) displaying the list of possible words to a user, receiving the user selection of a desired word and providing the selected word for further processing.

According to some embodiments of the invention, some of the plurality of keys are configured to be the default resting position of multiple fingers and non directional keystroke on those keys provide group letter entries wherein for each finger to key binding, directional keystroke on that key and/or keystrokes on adjacent keys are configured to enter the single letter entries of the letters that are members in that key letter group.

According to some embodiments of the invention, at least one of the keys is multifunction key.

According to some embodiments of the invention, the keystrokes are both non directional and directional keystrokes and the group letter entries are assigned to non directional keystrokes and the single letter entries are assigned to single letter entries.

According to some embodiments of the invention, directional keystrokes on the key assigned to single letter entries and non-directional keystroke is assigned to a letter group entry wherein the members of that letter group are the letters assigned to the single letter entries of that key.

According to some embodiments of the invention, the letter group entry comprises a probability measure for each letter in the letter group.

According to some embodiments of the invention, the order of the list of possible words is affected by the probability measure.

According to some embodiments of the invention, the keyboard comprises at least one region on a touch surface or touch screen.

The method of claim 8, wherein touching on some positions on the touch screen are interpreted as single letter entries while touching on other positions interpreted as letter group entries.

According to some embodiments of the invention, the letters of the letter group entries are determined by the relationship between the position of the touch of the finger on the touch screen to the positions of the single letter entry key areas on the touch screen.

According to some embodiments of the invention, a probability measure for letter in the letter group entry is determined by the distance between the position of the touch of the finger on the touch screen to the positions of the single letter entry key areas on the touch screen.

According to some embodiments of the invention, the key is a region on a touch screen, the directional keystrokes are swipes on the touch screen and the non-directional keystroke is touch on the touch screen.

According to some embodiments of the invention, a space entry key is positioned in the center of the keyboard, letter group entries keys are positioned adjacently to the space key and single letter entries keys are positioned in proximity to the edges of the keyboard.

According to some embodiments of the invention, the keyboard are presented on the touch screen whenever a finger or an object are swiped across the touch screen edge, different letter entry are conditioned upon the relative distance and angle of the finger lift up from the edge crossing position and group letter entries are associated with shorter distances then letter group entries.

According to some embodiments of the invention, different types of the keyboards are activated wherein the swipe position is performed over different positions on the touch screen edge.

According to an aspect of some embodiments of the present invention there is provided a text entry system for an electronic device comprising:

(a) an input subsystem receives a sequence of keystrokes performed over a plurality of keys of a keyboard of the electronic device, wherein a single keystroke enters a single letter location in a word, and wherein the set of the keystrokes comprises a first set of keystrokes for single letter entries that select single letter in an alphabet and a second set of keystrokes for letter group entries that selects a group of possible letters from the alphabet for a single letter location entry;

(b) a text prediction subsystem receives a sequence of the single letter entries and letter group entries, and produces a list of possible words the user intends to enter based on a priori database of words by searching in the word database words having letters that match the sequence of letter entries; and (c) a word processing subsystem, receives the list of possible words, displaying the list of possible words to a user, receives the user selection of a desired word and provides the selected word for further processing.

According to some embodiments of the invention, some of the plurality of keys are configured to be the default resting position of multiple fingers and non directional keystroke on those keys provide group letter entries wherein for each finger to key binding, directional keystroke on that key and/or keystrokes on adjacent keys are configured to enter the single letter entries of the letters that are members in that key letter group.

According to some embodiments of the invention, at least one of the keys is multifunction key.

According to some embodiments of the invention, directional keystrokes on the key assigned to single letter entries and non-directional keystroke is assigned to a letter group entry wherein the members of that letter group are the letters assigned to the single letter entries of that key.

According to some embodiments of the invention, the key is a region on a touch screen, the directional keystrokes are swipes on the touch screen and the non-directional keystroke is touch on the touch screen.

BRIEF DESCRIPTION OF THE DRAWINGS

The invention is herein described, by way of example only, with reference to the accompanying drawings, wherein:

FIG. 7 is a front view of a touch screen QWERTY style keyboard and illustrations of touch locations processing, in accordance with a preferred embodiment of the present invention;

FIG. 8 is a front view of multifunctional keypad implemented on a touch screen smart phone, in accordance with a preferred embodiment of the present invention;

DESCRIPTION OF THE PREFERRED EMBODIMENTS

Figure 1:
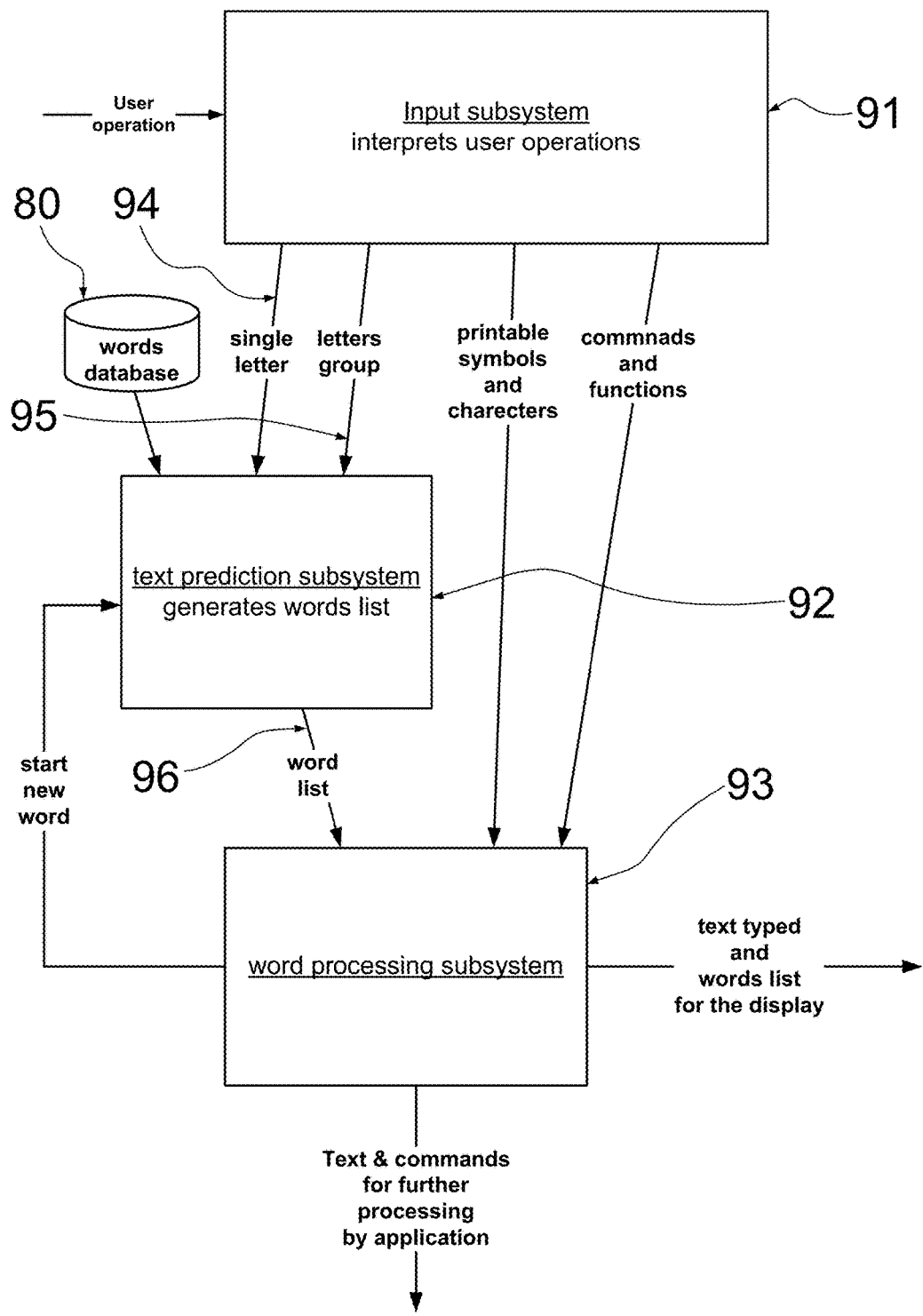
FIG. 1 is a simplified block diagram of the implementation of the text entry system, in accordance with a preferred embodiment of the invention.

The present invention, in some embodiments thereof, relates to user interface and, more particularly, but not exclusively, to text entry.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

There are many types of text entry methods, keyboard based, hand writing recognition and voice recognition are few examples. This application is limited to text entry methods that are based on a sequence of keystrokes performed by a user wherein in each keystroke a single successive letter location entry in a word is performed.

As used herein, the term "key" means a distinct object or a distinct area on an input device, e.g., keypad or keyboard. The term "keystroke" means a single gesture on a single key. The gesture can be a press operation or a touch operation or a swipe operation or any type of movement of the key or movement of the finger or any other object over the input device surface.

The phrase "successive letter location entry in a word" may be ambiguous and need a precise definition in the context of the invention. The phrase comprises from two key terms, the term "word" and the term "letter". Those terms in the context of the current invention will be precisely defined hereinafter. Words and letters may have different interpretation in different languages so the following section gives a precise definition of those terms in the context of the present invention.

The first term in discussion, a "word", is a common ground in all languages. Taking the definition from Wiktionary (www.wiktionary.org), the term "word" hereinafter means a distinct unit of language (sounds in speech or written letters) with a particular meaning. In speech, a word is sounded between silence segments. In write or print, a word appearing between spaces and/or punctuation marks. The aim of text entry is to provide to the user a way to enter words to a computer system. The number of distinct words in a language is dynamic and can be anywhere between few thousands to few hundreds of thousand of words in a rich wide spread spoken language, like English. The word representation depends on the media or domain that transport or store the text. For example, in speech domain the word is constructed from a sequence of phonetic units comprises from vowels and consonants. In handwriting and printing the word is comprises from a sequence of symbols known also as characters or letters. The representation of a word in different languages, both in handwriting and in print, is very diverse from language to language. In most languages the written or printed symbols are referred as letters and each letter is related to a phonetic unit. The full set of the letters referred as the alphabet. English alphabet comprises of twenty-six letters, the letters A to Z. Other languages have different size of alphabet. Greek alphabet has only twenty-four letters. Hebrew has only twenty-two letters. Russian alphabet consists of thirty-three letters and modern Malayalam alphabet has forty-nine letters alphabet with thirteen vowel letters and thirty-six consonant letters. Some languages, such as many oriental languages, combine several phonetic to a single written symbol. In the extreme case, each word has its own distinct symbols. For example, in Japanese there are two symbols system the kanji, which is a symbol per word system that have 1945 symbols and the kana, which is system of pairs of phonetic units, consonant plus vowel, that have 71 written symbols. To cope with this variety of languages, text storing and printing, Unicode standard was formed in 1988. It supports more than 110,000 symbols, characters and letters covering 100 scripts. Another type of universal effort to represent all human languages is IPA. IPA is an international phonetic alphabet that creates an alphabetic system of phonetic notation based primarily on the Latin alphabet. It is a standard representation of the sounds of oral language. 107 letters represent consonants and vowels, 31 diacritics are used to modify these, and 19 additional signs indicate qualities such as length, tone, stress, and intonation.

In languages where the number of symbols or letters is greater or much greater then in English, a sequence of Latin letter keys is used to enter a single letter in the language. For example, one way to enter Japanese kana symbols is by a sequence of Latin, i.e., Roman, letters. Such a method is known as Romanization which is very popular way to enter words in far-east languages.

The current invention is not specific to any language or any specific variant of entering a text in a language but it limited to a text entry methods that use a letter system to enter words. The invention focused on the text entry aspects so letters in the context of this application are the letter representation in the domain of the input operations.

As used hereinafter, the term "letter" means a member in an alphabet wherein a sequence of letters injectively defines a word in a language.

As used hereinafter, the term "alphabet" means a set of all letters used in a particular letter representation of a language. The alphabet in the context of the invention is the alphabet used by the input subsystem.

As used hereinafter, the term "letter location" or in brief "location" means a place in the letter sequence that defines a word. For example, a four letter word has four locations and the first letter location is the first element in the sequence, the second location is the second element and so on.

As used hereinafter, the term "step" in word entry means a letter entry to single letter location.

It should be understood that in general, as demonstrated above, a language might have more then one letter representation system. For example, Japanese kana have 71 letters in its native written graphic alphabet but only 26 letters in its Romanization letter system. If we use IPA representation for Japanese a 157 (=107+31+19) letter alphabet is used. Letter sequence representing a word may be different in different representations but in all cases the representation is injective and only one specific word is map to the specific letter sequence.

In any of the representations, the dictionary, i.e. the database of all words in a language, comprises of a set of all letter sequences corresponding to the set of all words in the language.

The invention is limited to text entry systems that enable entering words in successive steps. In each step, a single letter location is entered.

As used hereinafter, the term "single letter entry" means entry of a specific single letter into a single letter location.

As used hereinafter, the term "unambiguous text entry" means a text entry method that comprises a sequence of specific letter entry to enter words in a language. A sequence of specific letter entries is a one to one map to a specific word hence determines unambiguous the word.

As used hereinafter, the term "ambiguous text entry" or synonymously "predictive text entry" means a text entry method where potentially in at least one letter location entry of a word, instead of a single letter entry, an ambiguous letter entry comprises two or more possible letters for a single letter location is entered.

As used hereinafter, the term "letter group entry" means entry of two or more possible letters into a single letter location.

As used hereinafter, the term "probabilistic letter group entry" means entry of two or more possible letters into a single letter location wherein each letter is associated with a probability measure.

An example for the unambiguous text entry method using single letter entries is a standard QWERTY keyboard for English text entry. In this case, for each single letter location, a single Latin letter, A-Z, is entered by pressing a key of the letter in the keyboard. Note that entering Japanese in QWERTY keyboard is also unambiguous text entry method using single letter entries. In this case, the letter alphabet of Japanese, according to the definition used in this application, is still the letters A-Z and a sequence of those letters represents a unique word in Japanese. The fact that a couple or triple of Roman letters construct an intermediate representation of kana letters should not misinterpret the essence of to this invention since the relevant set of letters is the set of letters determined by the input subsystem or the set of input keystrokes. In similar way, in text entry for many other languages the letter alphabet relevant to this invention is the set of letters dictated by the set of input keystrokes. The fact that such input set may be converted injectively to different set during data processing or representing of the converted letter in the screen is an independent implementation issue and should not be misinterpreted as the term letter in the accordance with the invention.

An example for letter group entry that created ambiguous text entry is T9, a text entry method on a phone numeric keypad. T9 assign the 26 Latin letters in groups to 8 keys of a numeric keypad. The letters A, B and C assigned to the #2 key, the letters D, E and F assigned to the #3 key, etc. There is no way in T9 text entry system to enter a specific single letter in to a single letter location.

Letter group entry creates an ambiguous text entry. For example, if a sequence of four group letter entries, with three letters in each group letter entry, is entered, three to the power of four, i.e., 81 possible words or words prefixes might be entered. However, since any letter representation of a language contains substantial redundancy some of the possible four letter sequences do not map to any valid word in the language. A text prediction subsystem reduces the ambiguity by providing a list of the possible valid words for the specific sequence of ambiguous text entry and a word processing subsystem further select the specific word from the list typically by receiving the user selection.

Another popular method to enter text on numeric keypad is Multi-tap. In Multi-tap one enter the letter A by pressing the #2 key once, B by pressing #2 key twice and C by pressing the #2 key three times. All other Latin letters are entered in the same way using keys #3 to #9. In the light of the letter definition of the current invention Multi-tap has eight letter input alphabet representation of English. The alphabet is the digits 2 to 9. Since each letter entry in this case is single letter, i.e., specific digit to a single location in the word representation it seems it is an unambiguous text entry method. However, this is not fully the case, an ambiguity problem arise from using a variable number of input letters to represent a Roman letter with ambiguity in the punctuation. For example the sequence {#2, #2, #2} might represent AAA or AB or BA or C. Without an additional punctuation letter to solve this ambiguity according to our definition the set of digits 2-9 are not a valid letter alphabet that represents English since it is not injective representation. This ambiguity is solved by adding punctuation entry. This usually done by setting timeout duration that if successive letter entry is performed with time difference greater then this timeout duration a punctuation entry is automatically inserted. The additional punctuation needed to be added to the alphabet in order to convert this input system to injective mapping system that provides injective mapping from letter sequence to a word. With the additional punctuation letter the set of digits 2-9 and the punctuation is a valid alphabet and letter system for English in accordance with the definitions set above.

The punctuation ambiguity demonstrated in the example of Multi-tap should not be misinterpreted as ambiguity raised from group letter entry. For example, group letter ambiguity in Multi-tap entry might exist if, in addition, the input subsystem provides the user a way to enter letter group entries. For example, lets examine the case where the user enters the letter group {'2','3'}, a punctuation letter and the letter group {'2','3'}. Pressing once on the input letter '2' enters A while pressing once on the input letter '3' enter B. The possible word prefixes are AA, AD, DA or DD. Without a punctuation letter, the ambiguity created in such a sequence entry could be the accumulated ambiguity created by both the letter group entry and the punctuation ambiguity. In this case, the possible word prefixes are larger (six instead of 4) and are AA, B, AD, DA, DD or E.

To summarize this discussion, the term letter means a member in an input subsystem alphabet wherein a sequence of letters injectively defines a word in a language. While plurality of letter representations may be available for any language, in the context of the application, the letter system that is used is the one that used in the input subsystem or equivalently the letters that are assigned to key presses or keystrokes. In the interpretation of the application description and the claims language this letter term interpretation should be used. For example, if a text entry method for a language is using a Romanization technique, the letters corresponding to this text entry system are A-Z. If a text entry method for a language is using a presses on a standard numeric keypad the letters corresponding to this system are the digits 0-9. Based on the input device, e.g., the keyboard, variety of different alphabets may be used for entering a text in a language.

Most text entry methods can be categorized into one of the two following categories: (1) a single letter based text entry, where each letter location is entered with an explicit letter by a single keystroke; and (2) a letter group (or predictive text) text entry, where the content of each letter location is not set explicitly to a specific letter rather to a group of letters. Optionally, probability measure for each letter in the group is given. A text prediction is used to resolve the ambiguity created by the letter group entries and in some cases further user assistant in selection of the specific word is used as well.

Hereinafter, all embodiments and examples in the application are for the English language using the letters A-Z as the alphabet. Although the invention has been described in conjunction with these specific embodiments thereof, it is evident that those having skill in the art may make the necessary modifications to implement this invention in any language and any input alphabet chosen to represent the language in according to the selection of specific input device. The input alphabet includes but not limited to natural print letter of the language, the Latin letters, the digits, etc.

The current invention teaches using both single letter entries and group letter entries together. At first glance such a solution seems to be unnecessary overhead since it needs more keys (or distinct keystrokes) then a single letter text entry method. For example if one takes the English language, in addition to the 26 distinct letter keys we need another several keys for group letter entries. The additional keys seem to be unnecessary since the user can choose the precise letter in a single keystroke so why the user should bother entering an ambiguous entry? In a mobile environment where key space are even more restrictive it looks even more ridiculous since in many cases we already are short with keys and use only letter group entries.

Notwithstanding the above we will see hereinafter that there are many embodiments, both for desktop computing and mobile devices, where such an arrangement do not posses to much overhead but carry many advantages.

Before explaining at least one embodiment of the invention in detail, it is to be understood that the invention is not limited in its application to the details set forth in the following description or exemplified by the Examples. The invention is capable of other embodiments or of being practiced or carried out in various ways. Also, it is to be understood that the phraseology and terminology employed herein is for the purpose of description and should not be regarded as limiting.

Examples

Reference is now made to the following examples, which together with the above descriptions illustrate some embodiments of the invention in a non limiting fashion.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

For purposes of better understanding some embodiments of the present invention, reference is first made to FIG. 1. FIG. 1 illustrates a typical block diagram of a text entry system embodiment in accordance with the present invention. The text entry system is split into three subsystems:

(a) an input subsystem 91;
(b) a text prediction subsystem 92; and
(c) a word processing subsystem 93.

Input subsystem 91 receives the user actions input operations, e.g. keystrokes, on the input device. Input subsystem 91 interprets the user operations, e.g., the sequence of keystrokes, and separates the entries to three categories: (1) letter entries, (2) other printable symbols or characters, and (3) commands or functions. The letter entries are further split into single letter entries 94 and letter group entries 95. Both single letter entries and letter group entries are sent to text prediction subsystem 92. The other printable symbols and characters may be word separation symbols like spaces commas or other punctuation symbols, digits, math symbols, currency symbols, graphic symbols such as arrows, boxes, etc. or any other symbols used to be printed in a text. The commands or functions may be commands and functions that are not related to text entry such as increase or decrease the volume, open and close applications or commands or functions that are directly related to the text entry such as select a word from word list, set the text curser location, increase or decrease font size, change font type or color etc.

Figure 2:
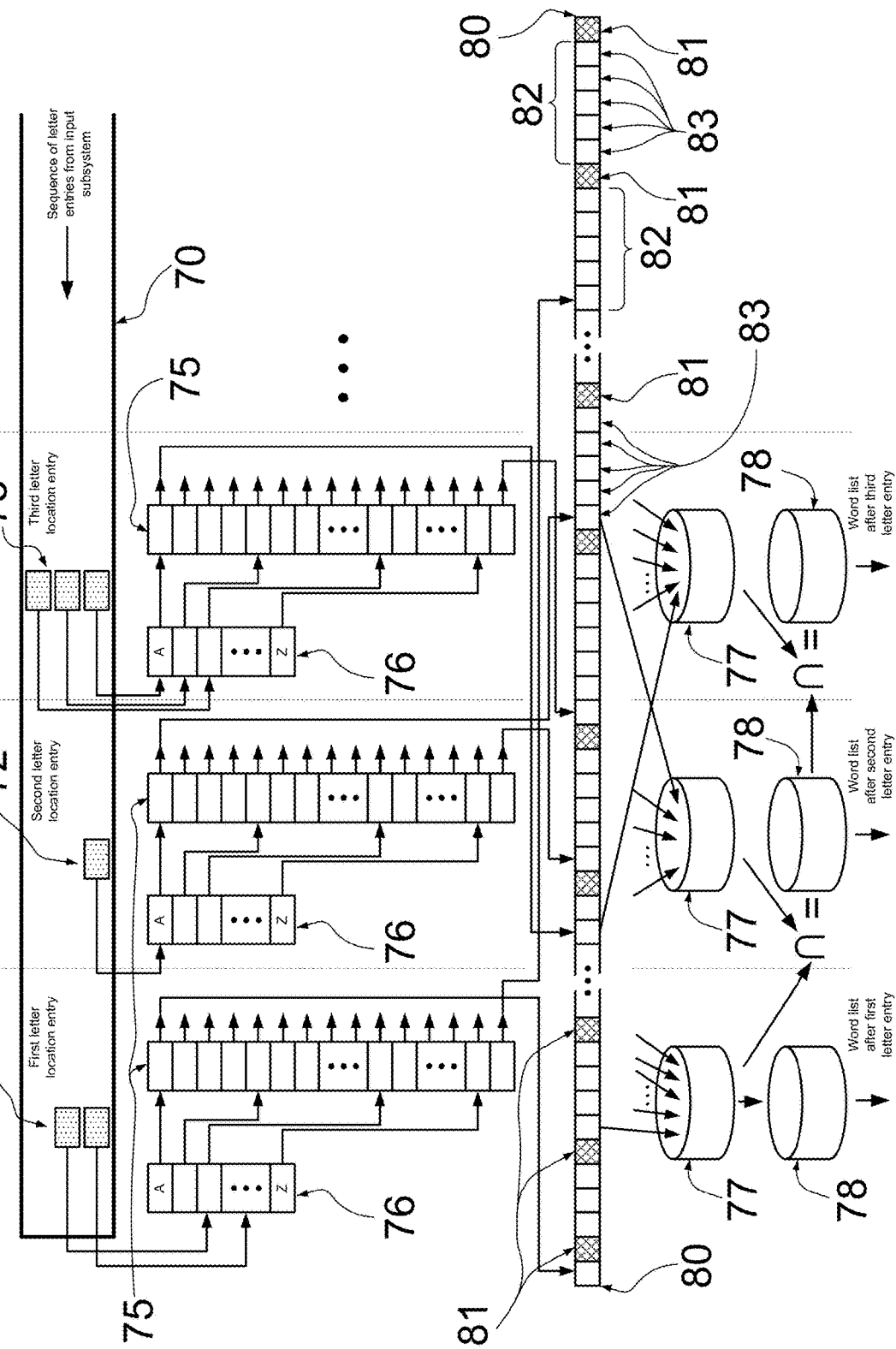
FIG. 2 is a conceptual data structure and data flow of a text prediction subsystem, in accordance with a preferred embodiment of the invention.

Each time text prediction subsystem 92 gets a new letter entry, either single letter entry 94 or letter group entry 95, it updates a list of possible words 96. Word list 96 is based on the sequence of single letter entries and letter group entries provided starting from the first letter location entry of the word until the current letter location entry. After each new letter entry, the updated word list 96 is sent to a word processing subsystem 93. Text prediction subsystems 92 are well known in the art and the present innovation may be implemented in variety of ways. FIG. 2 illustrates an exemplary embodiment of text prediction subsystems 92 in accordance with the current invention. Optionally, text prediction subsystem 92 with learning features which adapt itself to user texting history and preference is used. Such text prediction subsystems optionally update word database 80 with new words used by the user as well as adjust the associated probabilities of words in accordance to the user texting history. Optionally, text prediction subsystems provide word list 96 with word length greater then the current letter location entered. This feature is referred as word completion.

Word processing subsystem 93 sends the current typed text, and optionally, word list 96 to a display. In addition, if the user enters a non-letter entry, such as punctuation, symbol, or a select a word from word list 96, word processing subsystem 93 sends to text prediction subsystems 92 a command indicating that the current word entry ended and the text prediction subsystem should restart itself and be ready for starting a reception of letter entries of a new word. In addition, word processing subsystem 93 updates the display and sends the resulted text field for further processing by the application. The present invention can be used with variety types of word processing subsystems 93 and with many ways of displaying and selecting word list 96.

Due to the ability to make both single letter entry and letter group entry in each location, the user can dynamically control the length of the word list and trade between speed of texting and amount of ambiguity to resolve. This capability enhances the usability of word completion.

Reference is now made to FIG. 2. FIG. 2 illustrates a data structure and data flow diagram of a text prediction subsystem in accordance with the present invention. Text prediction subsystem 92 incorporates a word database 80. The word database consists of all the words in the language. There are many potential ways to store the word database.

In this illustration, word database 80 is stored as a long letter string. To distinguish between words in word database 80 end-of-word flags 81 are inserted at the end of each word 82. Each word is build from one or more letters 83. For the sake of clarity, word database 80 in the figure is fragmented and the illustration contains only nine words. Typically the word database 80 contains 10,000 to 100,000 words. Typically each letter 83 and end-of-word flag 81 stored in a single byte so the total size of the database may start from several tens of KB and can be as large as 1 MB. Text prediction subsystem 92 receives a sequence of letters entries from the input subsystem 91. The letter entries are entered to a letter entry stack 70. Letter entry stack 70 contains a letter entry for each letter location entry sent from input subsystem 91. In each location, either a single letter entry 94 or letter group entry 95 may be received. In the illustration, first letter location entry 71 is group letter entry containing two letters, second letter location entry 72 is single letter entry and third letter location entry 73 is group letter entry containing three letters. For the sake of clarity only three letter entries are illustrated in letter entry stack 70 but the stack can contains as many letters as needed to enter a single word.

To perform the text prediction processing efficiently, for each letter location, there are two supportive data structures. The first data structure is a word locator 75. Word locator 75 is an array of pointers to words in word database 80. Each element in the array is pointing to a start of a word. For the sake of illustration clarity, in the figure, only the first and the last pointers are drawn in complete indicating the reference from word locator 75 element to a word 82 in word database 80. All other elements are illustrated with short arrows to indicate that they are also referencing to words 82 in database 80.

Each letter location entry step has its own word locator 75 data structure. Elements of word locator 75 of the first letter location entry are ordered in the following way. First stored, are pointers to words that the first letter in the alphabet (A in English) is in the first letter location, wherein the most frequently used words are first and the least frequently used words are last. Next, pointers to words that the second letter in the alphabet (B in English) is in the first letter location, wherein the most frequently used words are first and the least frequently used words are last. The last segment of elements in word locator 75 of the first letter location entry contains pointers to words that the last letter in the alphabet (Z in English) is in the first letter location, wherein the most frequently used words are first and the least frequently used words are last.

Word locator 75 of the second letter location entry step is build similarly but the word pointers are ordered differently with respect to the second letter location. First stored, pointers to words that the first letter in the alphabet (A in English) is in the second letter location, wherein the most frequently used words are first and the least frequently used words are last. Next, pointers to words that the second letter in the alphabet (B in English) is in the second letter location, wherein the most frequently used words are first and the least frequently used words are last. The last segment of elements in word locator 75 of the second letter location contains pointers to words that the last letter in the alphabet (Z in English) is in the second letter location, wherein the most frequently used words are first and the least frequently used words are last.

Word locator 75 of the third letter location is ordered similarly and so are word locators 75 for all other letter locations that are not shown in the figure for the sake of clarity.

The second supportive data structure is letter locator 76 data structure. Letter locator 76 is an array of pointers to word locator 75 elements. Letter locator 76 array size is the size of the alphabet (26 in English). For the sake of clarity in the figure the first element is labeled with 'A' and the last element is labeled with 'Z', however this is only for clarity reasons and the actual letter set depended on the actual letter system that is used. Each element of letter locator 76 in the array is pointing to the first element in word locator 75 that in turn is pointing to a word with the appropriate letter matching in the appropriate letter location in the word.

To better understand how text prediction subsystem 92 uses this two supportive data structures 75 and 76 in conjunction with word database 80, let us assume for a moment that the first letter location entry was a single letter entry that selects the first letter in the alphabet, e.g., the letter A. Text prediction subsystem 92 should provide in this case all the words that starts with the letter 'A'. Text prediction subsystem 92 fetches the letter entry and since it is the first letter in the alphabet it fetches the first element in letter locator 76. With the pointer that is stored in letter locator 76, text prediction subsystem 92 fetches the referenced element in word locator 75. The element in word locator 75 is pointing to a word 82 in word database 80. Next, text prediction subsystem 92 fetches the word from word database 80 by taking all letters from the first letter pointed by word locator 75 element until end-of-word flags 81 occurs. The word is added to the letter location match bucket 77. Letter location match bucket 77 is a data structure filled with all the words that match a letter location entry. Each letter location, e.g., first letter location, second letter location, etc., has its own letter location match bucket 77. Text prediction subsystem 92 continues to fetch elements from word locator 75, and in turn fetch the referenced word from word database 80 and add words to letter location match bucket 77 until it reach the element in word locator 75 that is referenced by the next letter in letter locator 76. In this point on time, bucket 77 contains all the words in the language that have in the first letter location of the word the first letter in the alphabet. Similarly, if a different single letter entry is received from input system 91, i.e. any other single letter from the alphabet text prediction subsystem 92 will fetch the proper elements from letter locator 76 and in similar manner fill bucket 77 with the words that match the selected letter in the first location. If a letter group entry is received from the input subsystem 91 then for each letter in the letter group the text prediction subsystem 92 will fill bucket 77 with the matching words so bucket 77 will contain all possible words in the language that match any one of the letters in the group. For example, as illustrated in FIG. 2, if the first letter location entry was group latter containing two letters, e.g., 'C' and 'L', letter location match bucket 77 will contain all words in English with 'C' or 'L' in the first letter location. The words "can", "car", "could", "late", "like", "long" are few examples of many words in English that match this first letter location entry.

The processing taken by text prediction subsystem 92 in response to receiving subsequent letter location entries, e.g., second, third, fourth letter location entries etc., is similar to the first one but each letter location step use its own word locator 75, letter locator 76 and letter location match bucket 77. All steps use the same word database 80.

For example, continuing with the input sequence illustrated in FIG. 2, the second letter entry is single letter entry of the letter 'A' so text prediction subsystem 92 will fetch the words and fill bucket 77 (the bucket of the second letter entry) with all the words in word database 80 that are referenced by elements in word locator 75 (the word locator of the second letter location) that are in between the elements pointed by letter locator 76 element 'A' and letter locator 76 element 'B'. In this case, bucket 77 will contain words like "back", "can", "car", "day", "date", "late", etc.

Continuing with the example illustrated in FIG. 2, the third letter entry is a letter group entry with three letters in the group. Specifically in the illustration, assuming English language is used, the letters 'A', 'B' and 'C' are selected by the user. Letter location match bucket 77 of the third letter location entry will contain words like "baby", "back", "board", "boat", "cab", "cache", "fabulous", "face", "lack", "lab", etc.

Each letter location step processing produces quite large buckets so the actual implementation may not necessary actually copy the words to the bucket but just keep a compact data structure virtually hold the words and can be efficiently used in the final processing step of producing a word list to word processing subsystem 93 describe hereinafter.

Text prediction subsystem 92 generates a new word list 96 after each step of receiving new letter entry from input subsystem 91. Optionally, since in the first letter locations the list of possible words is typically large, text prediction subsystem 92 start generating word list 96 only from the second or the third or any other greater then one letter location. Optionally, text prediction subsystem 92 generates a word list that is limited to a maximum number of words which is less then all possible words that mach the letter entry sequence. Optionally, this list contains the more frequent or more probable words.

Returning to FIG. 2, the last step taken by text prediction subsystem 92 is to provide word list 96. This is done by having additional bucket for each letter entry step, a word list bucket 78. In the first letter location entry, text prediction subsystem 92 just copies the words from letter location match bucket 77. If a limit on the list size exists, only the most frequent words determined by their location in word locator 75 are provided. In case of group letter entry, several words from each letter segment in word locator 75 are taken. For example if the maximum list size is ten and group letter with two letters is received, five words from the top of the first letter and five words from the top of the second letter will be selected.

In the second letter location entry step word list 76 must reflect both limitation of first letter location entry and second letter location entry. To find the suitable word list for this case, the set of words in letter location match bucket 77 of the first letter location entry step and the set of words in letter location match bucket 77 of the second location entry step should be intersected. The words that are in both sets are added to the word list bucket 78 of the second letter location entry. The words in this bucket are delivered to the word processing subsystem 93 as the word list 96 of this step. In the example provided hereinabove the first location entry bucket contains words that have 'C' and 'L' and the second location entry bucket contains words with 'A' in the second letter location so the intersection will contain words like: "cab", "can", "car", "lack", "lab", "late", etc. Those words are in both sets so they will be added to word list bucket 78.

In the case where a length limit is set to word list 96, the intersecting processing is stopped when reaching the size limit. The intersection check is done from the most frequent to the least frequent words. Optionally, the most frequent words selected for the overlap check is taken alternately from both buckets.

Word list processing for further letter location entry step is done similarly. Each letter location entry as its own word list bucket 78 and the intersection processing is done between the local letter location match bucket 77 and previous step word list bucket 78 as illustrated in the figure. In the example provided hereinabove the set of words the started with 'C' or 'L' and are proceeded with the letter 'A' are now intersect with the set of words with the letter 'A' or 'B' or 'C' in the third letter location. The intersect of previous step word list bucket 78 with the current step letter location match bucket 77 will provide the words: "cab", "cache", "lab", "lack" etc. Those words are in both sets so they will be added to word list bucket 78.

In FIG. 2 the processing is done in the input subsystem letter representation of the language. It will be possible for a person skilled in the art to convert from one letter representation to another letter representation in any stage of the processing. For example, taking Japanese with Romanization input letter entry. The word database 80 may be stored in kana while the word locator 76 is based on the Latin letters and the pointers are actually doing the conversion between the different letters systems. Alternatively, all processing is done in Latin letters and only in the final stage or in the word processing subsystem the conversion from Latin letters to kana symbols is done. Yet another alternative is to convert the Latin letter system to kana in input subsystem 91 or in the initial processing of letter entry stack 70. In all cases the key element in the present invention is that the input subsystem configured to provide, in the letter system it using, both single letter entry and letter group entry in any letter location entry step.

In an exemplary embodiment of the invention, word database 80 may be compacted by overlapping storage of words with overlapping strings. For example the words "string" and "ring" can be stored together. To reach the word "string" a pointer to the letter 's' is provided and to reach the word "ring" a pointer to the letter 'r' which is increment of two from the pointer to the letter 's' is provided.

In an exemplary embodiment of the invention, improvements in the probability models that effect choosing the words that will be delivered in the word list may be provided. One such a model will be provided later on in this application.

It will be appreciated by persons skilled in the art that the present text prediction architecture is not limited to what has been particularly shown and described hereinabove rather, the scope of the present invention includes many combinations and sub-combinations of various operations and various methods to provide the word list in accordance with the sequence of letter location entries.

Figure 3:
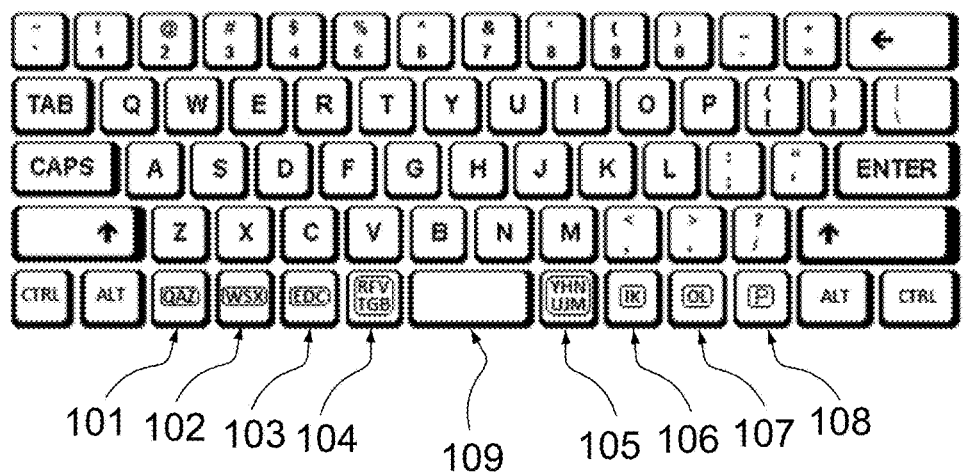
FIG. 3 is a front view of a keyboard, in accordance with a preferred embodiment of the present invention.
Figure 4:
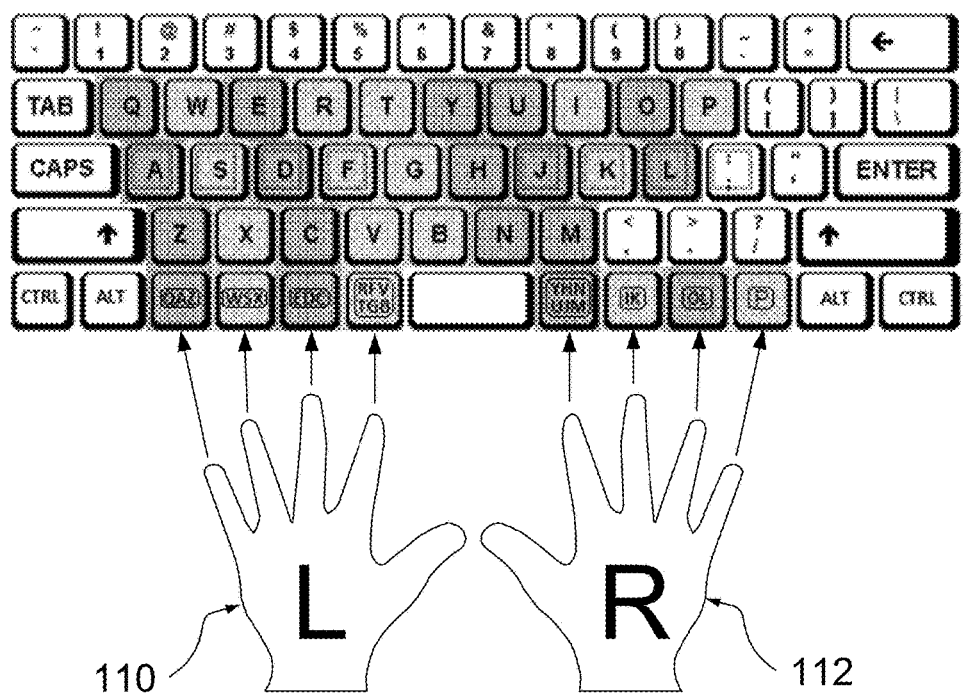
FIG. 4 is a usage illustration of the keypad arrangement shown in FIG. 3, in accordance with a preferred embodiment of the invention.

Reference is now made to FIG. 3. Keyboard 100 is a standard QWERTY keyboard with additional 8 keys 101-108 as illustrated in FIG. 1. The eight additional keys 101-108 are group letter entry keys. Keys 101-108 are not occupying extra space on the keyboard rather take space from the space key 109. This keyboard arrangement is configured to enhance touch-typing. The letter group keys 101-108 are configured to enter the same letters that each of the eight fingers is typing using touch-typing. The keyboard is configured to allow faster touch-typing by allowing the fingers to stay at all time on keys 101-108 rather then move the finger to adjacent keys. FIG. 4 illustrates the recommended positions of the fingers on keys 101-108. The fingers of left hand 110 are placed to the left of space key 109 and the fingers of right hand 112 are placed to the right of space key 109.

Key 101 is configured to be pressed by the little finger of left hand 110. In standard touch-typing this finger is resting on the A key and typing the letters Q, A and Z. Accordingly, key 101, labeled with QAZ surrounded by a box, is a letter group entry that enter the group of the letters Q, A and Z.

Key 102 is configured to be pressed by the ring finger of left hand 110. In standard touch-typing this finger is resting on the S key and typing the letters W, S and X. Accordingly, key 102, labeled with WSX surrounded by a box, is a letter group entry that enter the group of the letters W, S and X.

Similarly, keys 103 and 104 are configured to be pressed by middle finger and index finger of left hand 110 and the keys group letter assignment is according to the touch-typing letters used by each finger as illustrated in FIG. 4. Keys 105-108 are configured to be pressed by index finger, middle finger, ring finger and little finger of right hand 112 respectably. Similarly, the letter assignment is with respect to the touch-typing letters used by the matching finger.

In each letter location entry the user can decide to enter the standard QWERTY single letter entry, preferably with the proper finger in accordance with touch-typing recommendations, or a group letter entry with the group letters keys 101-108.

To support typing on keys 101-108, a text prediction subsystem is used to generate a possible word list from a sequence comprises a mixture of single letter entries and letter group entries. The word processing subsystem is used to process the word list coming from the text prediction subsystem and select the chosen word as illustrated in FIG. 1.

There are many modification and different key assignments that can be applied for this basic mixture of single letter keys, i.e., entries, and letter group keys in the keyboard. For example, the user may switch the functionality of keys A, S, D, F, J, K and L with keys 101-108 to keep the fingers in the same location of keys in the keyboard. In this case, letter group entry touch-typing is done with fingers on the original position of touch-typing in original QWERTY keyboard. In an exemplary embodiment of the invention, the user may assign different letter groups to keys 101-108 to provide better letter balance in the letter groups. In specific, key 108 that in accordance with touch-typing assign actually to single letter entry of the letter P may assigned with another letters. In an exemplary embodiment of the invention, key 105 is assigned to the group letter {YHN}, key 106 is assigned to the group letter {UJM}, key 107 is assigned to the group letter {IK} and key 108 is assigned to the group letter {OLP}

Other layouts with different mixture of keys and different positions of single letter keys and group letter keys may be provided.

Figure 5:
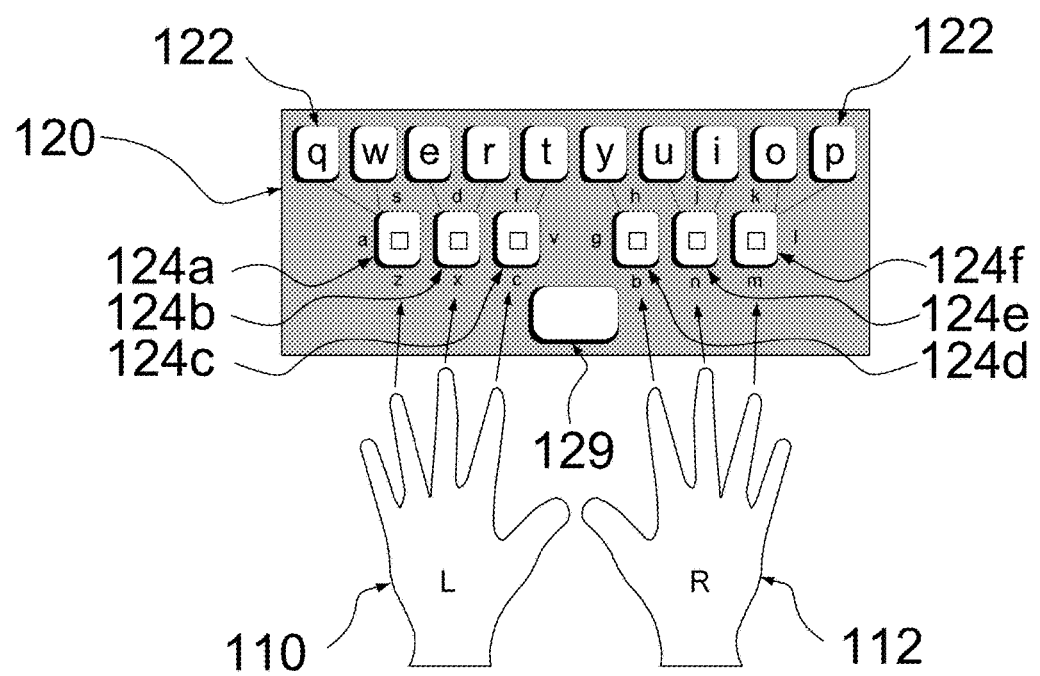
FIG. 5 is a front view of a QWERTY like multifunctional keypad, in accordance with a preferred embodiment of the present invention.

Reference is no made to FIG. 5. FIG. 5 illustrates a QWERTY like keypad wherein several keys are multifunctional keys. The illustration in FIG. 5 focuses only on letter entry and other keys for digits, punctuations, symbols and other functions are omitted from the figure for clarity, but may be implemented as well in concrete embodiments. Keypad 120 comprises 10 mechanical simple press keys 122. Keys 122 are similar to the top letter row of a QWERTY keyboard that contains 10 letters keys. Pressing the leftmost key enter Q. Pressing the rightmost key enter P. The second key row comprises six keys 124a-124f. Keys 124a-124f are multifunction keys. Keys 124a-124f provide 16 single letter entries similar to the middle and bottom key rows in a standard QWERTY keyboard (9 letters (ASDF-GHJKL) from the middle row and seven letters (ZX- CVBNM) from the bottom row. In addition keys 124a-124f provide six group letter entries.

Key 124a and 124d have four distinct activation operations: (1) simple press or non directional press, i.e. press in the direction perpendicular to the keypad plane, (2) leftward press, (3) upward press and (4) downward press.

Key 124b and 124e have three distinct activation operations: (1) simple press, (2) upward press and (3) downward press.

Key 124c and 124f have four distinct activation operations: (1) simple press, (2) rightward press, (3) upward press and (4) downward press.

The non-directional press operation of keys 124a-124f is used for the group letter entries and the directional presses are used for single letter entries. The letters in the letter group of each key include the letters entered by the directional operation indicated by the letter labels surrounding keys 124a-124f and letters above the key from the top row keys 122 indicated by a line connecting between keys from keys 124a-124f to key form keys 122. The following table summarizes the letter entry options for keys 124a-124f.

| Key | Operation | Entry type | Entry letter(s) |
|---|---|---|---|
| 124a | Non Directional Press | Letter Group | Z, A, S, Q, W |
| 124a | Downward Press | Single Letter | Z |
| 124a | Leftward Press | Single Letter | A |
| 124a | Upward Press | Single Letter | S |
| 124b | Non Directional Press | Letter Group | X, D, E, R |
| 124b | Downward Press | Single Letter | X |
| 124b | Upward Press | Single Letter | D |
| 124c | Non Directional Press | Letter Group | C, V, F, T |
| 124c | Downward Press | Single Letter | C |
| 124c | Rightward Press | Single Letter | V |
| 124c | Upward Press | Single Letter | F |
| 124d | Non Directional Press | Letter Group | B, G, H, Y |
| 124d | Downward Press | Single Letter | B |
| 124d | Leftward Press | Single Letter | G |
| 124d | Upward Press | Single Letter | H |
| 124e | Non Directional Press | Letter Group | N, J, U, I |
| 124e | Downward Press | Single Letter | N |
| 124e | Upward Press | Single Letter | J |
| 124f | Non Directional Press | Letter Group | M, L, K, O, P |
| 124f | Downward Press | Single Letter | M |
| 124f | Rightward Press | Single Letter | L |
| 124f | Upward Press | Single Letter | K |

Under the second row of keys 124a-124f the space key 129 is provided. Optionally, other keys are provided. For clarity reasons only letter entry keys are illustrated in FIG. 5. The keyboard illustrated in FIG. 5 is configured for high throughput touch-typing with six fingers. In the default touch-typing position, the ring finger of left hand 110 is positioned on key 124a, the middle finger of left hand 110 is positioned on key 124b, the index finger of left hand 110 is positioned on key 124c, the index finger of right hand 112 is positioned on key 124d, the middle finger of right hand 112 is positioned on key 124e and the ring finger of right hand 112 is positioned on key 124f. In this finger configuration, each finger with directional press or small movement combined with non-directional press enters 4 to 5 single letter entries. By pressing on the key the finger is resting on, the finger enters a letter group comprises all the letters that this finger is configured to enter as single letter entry. Such configuration provides very high typing speed after short practice. The more frequent words in the language are entered solely using very fast letter group entries performed by a press on a key where the finger is already resting on. The less frequent words may be entered using a mixture of single letter entries and letter group entries. On the rare case of very infrequent words or words that are not in the dictionary, solely single letter entries are used. However, even in this case, the fingers are still resides on the same keys, if directional press is performed, or make just a small upward movement combined with a press otherwise.

Figure 6:
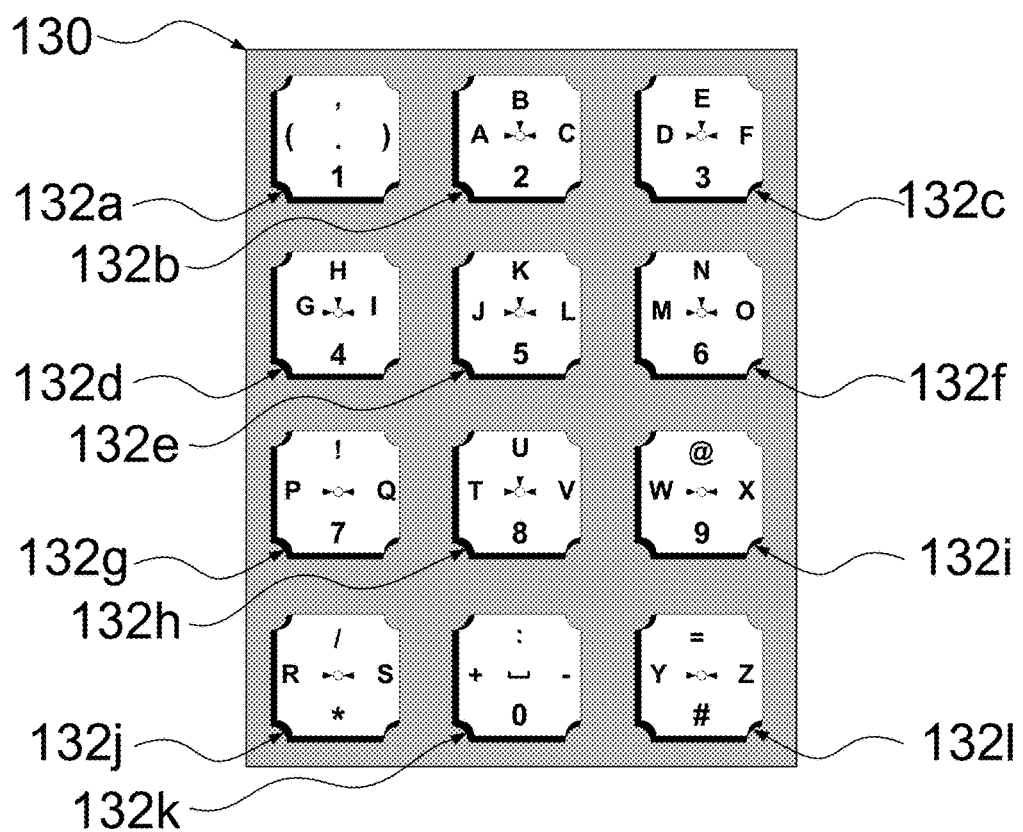
FIG. 6 is a front view of multifunctional numeric keypad, in accordance with a preferred embodiment of the present invention.

Reference is now made to FIG. 6. FIG. 6 illustrates a 3×4 keys numeric keypad wherein each key is 5-way multifunctional key. Keypad 130 comprises twelve 5-way multifunction keys 132a-132l. Each key 132a-132l has five distinct activation operations: (1) simple or non directional press, i.e. press in the direction perpendicular to the keypad plane, (2) rightward press, (3) leftward press, (4) upward press and (5) downward press.

The ten digits and the star and pound signs are assigned to keys in the keypad in the same way as in a standard telephone keypad and are entered using the downward press operation. Accordingly, the digits, the star and the pound signs are labeled in the bottom part of keys 132a and 132l.

The twenty six Roman letters assignment to keys is approximately in accordance with the North American dialing standard. For example, key 132b, which is assigned with the digit '2' key, is also assigned with the letters A, B and C. Single letter entry of the letter A is performed by leftward press on key 132b. Single letter entry of the letter B is performed by upward press on key 132b and single letter entry of the letter C is performed by rightward press on key 132b. Accordingly a label of the letter A is presented on the left part of key 132b and labels of the letter B and C are presented on the top and right parts of key 132b.

In North American dialing standard the keys associated with the digits '7' and '9' are assigned with four letters each. However, in the current embodiment, single letter entry operations for those keys, PQRS and WXYZ, are divided between four keys. Key 132g assigned with the letters P and Q and Key 132j assigned with the letters R and S. Key 132i assigned with the letters W and X and Key 132l assigned with the letters Y and Z. single letter entry of P, R, W and Y are performed using leftward press operation and single letter entry of Q, S, X and Z are performed using rightward press operation. The labels of those letters on the keys are located in the left and the right parts of the keys to reflect the appropriate leftward press or rightward press operations.

The non directional press operation in those ten keys that contains Roman letter assignments is reserved for letter group entry. The letters in each group contains all the single letter entry assigned to the key. To indicate which are the letters that are assigned to the non directional press operations, the central part of the key is labeled with small circle and corresponding arrows from each press direction the key is assigned letter in the key. For example, Key 132e is assigned with the letters J, K and L. The leftward press is assigned to the letter J entry, the upward press is assigned to the letter K entry and the rightward press is assigned to the letter L entry. Accordingly, the label J is printed on the left part of key 132e, the label K is printed on the top part of key 132e and the label L is printed on the right part of key 132e. The center of key 132e is labeled with a circle and arrows from left, up and right indicating that the non directional press of the key is a letter group entry with the letters {J,K,L} in the group.

In the embodiment illustrated in FIG. 6, Keys 132a and 132k do not contains letter entry and the keys are assigned with the symbols comma, dot, colon, space, parenthesis, plus and minus. Other symbols are assigned to the vacant operations in the other keys.

In this embodiment, the user is able to decide in each letter location entry whether he selects a letter group entry or a single letter entry. A single letter entry is slower then group letter since directional press is slightly more complex for the human motor system. The user may trades between text entry speed and comfort versus the text entry resolution or the amount of ambiguity. Too much ambiguity eventually may result additional effort and time in order to select the proper word from the list of possible words.

The following paragraphs present an example of typing text with the keypad illustrated in FIG. 6.

Assuming the user is typing the following sequence:
(1) non directional press on key 132*h*—{T,U,V};
(2) non directional press on key 132*d*—{G,H,I};
(3) non directional press on key 132*c*—{D,E,F}.

The text prediction subsystem process the input sequence as illustrated in FIG. 2 and search for a match of words that the first letter location is T, U or V, the second letter location is G, H or I and the third letter location is D, E or F. After the third letter entry the word list bucket 78 will contain words like 'the', 'theater', 'these', 'tide', 'tie', 'this', 'UHF', 'VHF', 'video', 'vie', 'view', 'viewer', etc. Since 'the' is the a priori most probable word, it will be at the top of the word list and entering a space, using non directional press on key 132*k*, will automatically insert to the text field the word 'the' followed by a space.

If the user wants to enter the word 'view' without the burden to select it from the possible words list, knowing that this word is less popular word, the user can enter explicitly the letter 'v' in the first letter location to narrow down the word list. This is done by entering the following input sequence:
(1) rightward press on key 132*h*—(v),
(2) non directional press key 132*d*—{G,H,I},
(3) non directional press key 132*c*—{D,E,F}.
In this case only words that start with the letter 'v' are presented in word list bucket 78. The words 'video', 'vie', 'view', 'viewer' will be the valid words shown on the words list. Entering a space will automatically select the most probable word, 'view' in this case, and insert to the text field the word 'view' followed by a space.

Reference is now made to FIGS. 6-11. FIGS. 6-11 illustrate text entry input subsystem embodiment that are using touch screens in accordance to the current invention. Using a touch screen opens new methods to differentiate between single letter entries and letter group entries. First of all, the press position of the finger on the touch screen is provided a higher resolution then a key activation in mechanical keyboards and single letters or letter groups entries may be differentiate by the fine position of the finger touch. Secondly, other features such as swipes, gestures and traces on the touch screen as well as pressure sensing or multi fingers touch may be used.

As used herein, the term "touch screen" means any surface or multiple surfaces with and without display underneath that collectively create an input device, e.g., a keyboard, and measure and provide the location of one or more objects, e.g., finger or stylus, in contact with the surface.

Reference is now made to FIG. 7. FIG. 7 illustrate a QWERTY keyboard implemented on a touch screen. For clarity, only keys related to letter entry are presented. Keyboard 140 is a touch screen with four rows of keys drawn on it. The top row contains 10 keys 142 with the letters Q, W, E, R, T, Y, U, I, O and P. The second row contains 9 keys 144 with the letters A, S, D, F, G, H, J, K and L. The third row contains 7 keys 146 with the letters Z, X, C, V, B, N and M. The bottom row contains the space key. The input subsystem is analyzing the touch location of the finger on the screen and generates single letter or letter group entries in accordance with the touch locations as explained hereinafter. Frame 140*a* represent keyboard 140. The keys locations are illustrated on frame 140*a* but for clarity the labels are omitted. Five different finger touch location markers 150*a*-150*e* are illustrated on frame 140*a*. When a finger touches the touch screen in keyboard 140 the input subsystem first determined if the touch was on a key area. Markers 150*a*-150*d* illustrate touches that are in keys area. Marker 150*e* illustrates a touch that is outside any of the keys in keyboard 140. In case the touch was on a key area, input subsystem further check if the touch is inside the single letter entry area 152. Single letter entry area 152 of each key is located in the center of the key and its size and shape (rectangular/circle) is a design parameter that may varied between keyboards. Alternatively, those parameters are user defined. In the exemplary case where the user makes a touch on location 150*a*, the touch is exactly at the center of the key and inside single letter entry area 152 of that key, the key of the letter H, hence input subsystem will transmit a single letter entry of the letter H to the text prediction subsystem. In the exemplary case where the user makes a touch on location 150*b*, the touch not at the center of the key but still inside single letter entry area 152 of that key, hence input subsystem will transmit a single letter entry, with the letter Z in this case, to the text prediction subsystem. When the user touches on location 150*c*, the touch is still inside the key but not inside the key single letter entry area 152. In this case input subsystem search for keys in proximity to touch location 150*c*. The distance of the search is illustrated in the figure by circle 154 centered around touch location 150*c*. In this example, four keys are in the letter group entry area 154, the key where the touch resides on, i.e., the F key, and the key just to the right on row 144, i.e. the G key, and two keys from the top row, keys R and T. The input subsystem, in this case, will transmit letter group entry to text prediction subsystem with the letters F, G, R and T in the group.

As illustrated in the figure, not all touch on a key outside a single letter entry area 152 will generate letter group entry. For example, touching on a location illustrated by marker 150*d* will have only the Q key inside letter group entry area 154 hence single letter entry with the letter Q will be generated.

In the case where a touch is performed outside any key area, as illustrated by marker 150*e*, all keys inside letter group entry area 154 around the touch area will be provided. In this example, the keys of the letters I, O, J and K are inside letter group entry area 154 hence letter group entry with letters I, O, J and K will be transmitted to the text prediction subsystem.

If the touch is outside any letter key, and no letter key is inside letter group entry area 154 around the touch point, no letter entry will be generated.

As can be seen the group letter entry generated by the touch location 150*c* does not reflect that the user was more likely to enter F then any other letter. To overcome this limitation a probabilistic version of letter group entry is introduced.

The probabilistic version of processing in input subsystem is illustrated using the illustration provided in frame 140*b*. Frame 140*b* represent keyboard 140. The keys locations are illustrated on frame 140*b* but for clarity the letters labels are omitted. The same five finger touch location markers 150*a*-150*e* are illustrated on frame 140*b* as well. User touch locations 150*a*, 150*b* and 150*d* generate single letter entry according to the same algorithm presented before. However, user touch locations 150*c* and 150*e* generate probabilistic version of letter group entries as explained hereinafter. In this exemplary case when the user makes a touch on location 150c, the input subsystem recognize that there are four keys, the keys of the letters F, G, R and T, in the letter group entry area 154. For those four keys the input subsystem calculates the distance between touch location 150c and the center of keys. Those distances are illustrated in the figure by vectors 156f, 156g, 156d and 156t. Each of the letters in the letter group entry is associated with a probability. The probability in this case is inversely related to the distance. Keys that are close to the touch location 150c will have higher probabilities and keys that are further away will have lower probability. The actual formula to calculate the probability may be varied. In an exemplary embodiment of the invention, the calculation of the letter probability is given by the following formula:

$$P_i = \frac{1}{d_i^2} / \sum_i \frac{1}{d_i^2}$$

where $d_i$ is the distance of key i and $P_i$ is the letter probability. The factor $$\sum_i \frac{1}{d_i^2}$$

is a normalization factor to set the sum of all probabilities of letters in the group to one. As will be explained later, the aim of the letter probabilities is to order the word list 78 (shown in FIG. 2) and depending on the actual ordering algorithm in many cases applying the normalization factor as in the above formula is unnecessary. In the case of the touch location 150c with the above probability formula calculation, the probabilistic letter group entry generated by the input subsystem is given in the table below.

| Letter | F | G | R | T |
|---|---|---|---|---|
| Probability [%] | 66.002 | 14.838 | 10.955 | 8.205 |

In the second exemplary case when the user makes a touch on location 150e, the input subsystem recognize that there are four keys, the keys of the letters I, O, J and K, in the letter group entry area 154. The input subsystem calculates the distance between touch location 150e and the center of keys I, O, J and K. Those distances are illustrated in the figure by vectors 156i, 156o, 156j and 156k. Accordingly, the probabilistic letter group entry is

| Letter | I | O | J | K |
|---|---|---|---|---|
| Probability [%] | 35.97181 | 17.09611 | 25.53863 | 21.39346 |

As expected, since the touch location 150e is out of any key and the distance from touch location 150e to the keys are in the same order the probabilities in this case are more even.

In an exemplary embodiment of the invention, the distance is calculated relative to key edges rather then key centers.

Reference is now made to FIG. 8. FIG. 8 illustrates a smart phone equipped with touch screen. The smart phone implements a soft keyboard with multifunctional keys that use swipes to differentiate single letter key entries from letter group entries.

Smart phone 10, comprises touch sensitive display 20. On touch sensitive display 20 a keypad area 160 is displayed when text entry is required. The keyboard comprises 5×4 keys array of multifunction keys 162. Each key 162 has five distinct activation operations: (1) a touch, (2) rightward swipe, (3) leftward swipe, (4) upward swipe and (5) downward swipe. Respectively, labels 164 are drawn on the (1) center, (2) right, (3) left, (4) top and (5) bottom to indicate the letter/symbol/function entry performed by the touch/swipe operations.

Frame 160a is an enlarge view of keypad area 160 focused only on the letter entry keys. The keyboard is designed in a way that the letters labels are located according to the well-known QWERTY keyboard layout. Top key row 166a contains five keys each assigned with two Roman letters and together contains all ten letters in a top row of QWERTY keyboard. Each single letter entry is either left or right swipe operation. Touch operation interprets as letter group entry with both letters in the group. For example, key 164c is assigned with the single letter entry T for the left swipe, the single letter entry Y for the right swipe and letter group entry {T,Y} for the touch operation.

To assign the nine letters of standard second row of QWERTY keyboard with the five keys of second key row 166b the following assignment is used:

| Key | Operation | Entry type | Entry letter(s) |
|---|---|---|---|
| Left | Right swipe | Single Letter | A |
| Left | Touch | Single Letter | A |
| 2$^{nd}$ | Left swipe | Single Letter | D |
| 2$^{nd}$ | Right swipe | Single Letter | D |
| 2$^{nd}$ | Touch | Letter Group | S, D |
| 3$^{rd}$ | Left swipe | Single Letter | F |
| 3$^{rd}$ | Up swipe | Single Letter | G |
| 3$^{rd}$ | Right swipe | Single Letter | H |
| 3$^{rd}$ | Touch | Letter Group | F, G, H |
| 4$^{th}$ | Left swipe | Single Letter | J |
| 4$^{th}$ | Right swipe | Single Letter | K |
| 4$^{th}$ | Touch | Letter Group | J, K |
| Right | Left swipe | Single Letter | L |
| Right | Touch | Single Letter | L |

The assignment of the seven letters in a standard third row of QWERTY keyboard is done only to three of the five keys of third key row 166c. The following assignment is used:

| Key | Operation | Entry type | Entry letter(s) |
|---|---|---|---|
| Left | | Not used for letter entry | |
| 2$^{nd}$ | Left swipe | Single Letter | Z |
| 2$^{nd}$ | Right swipe | Single Letter | X |
| 2$^{nd}$ | Touch | Letter Group | Z, X |
| 3$^{rd}$ | Left swipe | Single Letter | C |
| 3$^{rd}$ | Up swipe | Single Letter | V |
| 3$^{rd}$ | Right swipe | Single Letter | B |
| 3$^{rd}$ | Touch | Letter Group | C, V, B |
| 4$^{th}$ | Left swipe | Single Letter | N |
| 4$^{th}$ | Right swipe | Single Letter | M |
| 4$^{th}$ | Touch | Letter Group | N, M |
| Right | | Not used for letter entry | |

The center key in the bottom row 166d is used for the space key. Touch operation as well as swipe left, swipe right and swipe up will enter a space. Down swipe operations in the middle 3×4 keys of keypad 160 is used for entry of digits and the star and pound signs.

Figure 9:
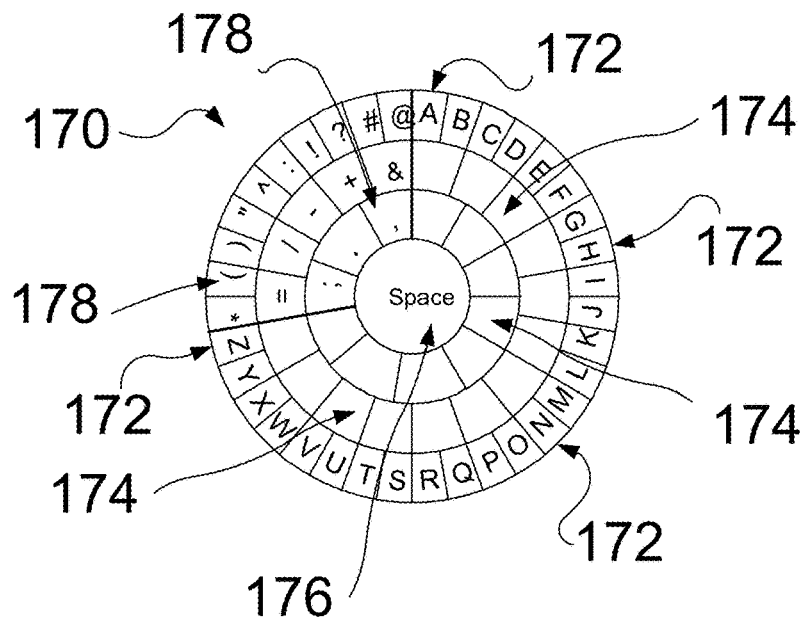
FIG. 9 is a front view of touch screen circular keypad, in accordance with a preferred embodiment of the present invention.

Reference is now made to FIG. 9. FIG. 9 illustrates a soft keyboard implemented on a touch screen with standard touch keys and a circular layout.

Keyboard touch sensitive surface 170 is shaped as a disk. Four different sections are configured in keyboard 170. The first section contains the outer ring keys 172 located in the sector between 0°-258°. The zero degree position is defined as the zero position in hour/min/sec of a clock. This sector contains keys for single letter entry and comprises 26 keys to enter the letters A to Z. The second section is the inner circle contains a single circular key 176 to enter a space.

The third section contains two inner rings of keys 174 located between the space key 176 and the single letter keys 172 and reside in the sector of 0°-258° as well. This sector contains the letter group entry keys.

The ring closer to keys 172 contains 13 keys that provide each letter group entry of two successive letters in English.

The ring closer to the center of the disk contains 8 keys that assign three or four successive letters in each letter group.

The last sector in the keyboard takes up the rest of keyboard 170 and contains 3 rows of keys 178. Keys 178 are assigned to other punctuations and symbols needed for text entry.

This keyboard arrangement, contains only simple touch keys, is a good demonstration of one of the main ideas behind the innovation. The space key 176 is the most frequently used in the language and is kept in the middle of keyboard 170. The key arrangement is configured in order for the user to trade between speed, i.e., finger movement distance and the amount of ambiguity. A small movement from the initial finger position, the space key, selects groups of three letters, hence creates larger ambiguity. Larger movement to the second ring selects groups of two letters which is less ambiguous. The most "costly", i.e., the largest finger movement and slowest but none ambiguous entry, is to enter single letter entry by selecting keys 172 in the outer ring.

Figure 10:
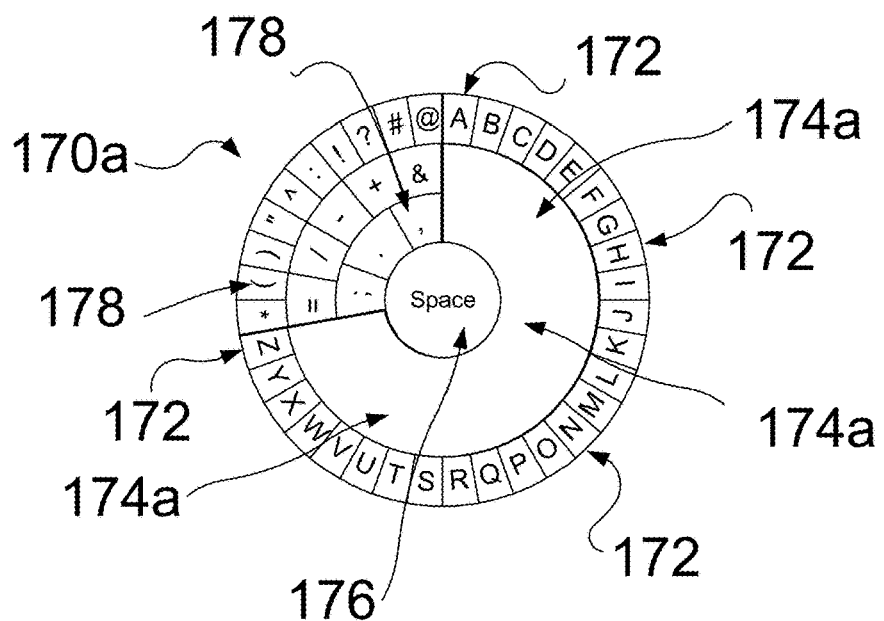
FIG. 10 is a front view of another touch screen circular keypad, in accordance with a preferred embodiment of the present invention.

Reference is now made to FIG. 10. FIG. 10 is keyboard embodiment similar to the one shown in FIG. 9, but is taking the advantage of the accurate read of the finger touch position that can be measured in touch screens. Keyboard 170a keys 172, 176 and 178 are the same as in previous embodiment, keyboard 170. The section of letter group entry that in previous embodiment was split into 21 keys 174 is in this embodiment, a single area 174a that does not contain any distinguishable keys. Touching area 174a still activate letter group entry, but the actual letters in the group are selected according to the exact position of the touch on the area 174a.

Similar to the embodiment described in the FIG. 7, this embodiment uses the concept of having a letter group entry with a probability associated with each letter in the group. The probability associated with each letter is based on the position of the touch of the finger on area 174a in polar coordinates. The radius r coordinate determines the letter entry resolution (larger r=>better resolution) and the angle $\theta$ determines the most probable letter.

One possible way to encode touch position in area 174a to a probabilistic letter group is the following:

(1) Setting outer radius of keyboard 170a to 1, space key 176 radius to 0.4, keys 172 inner radius to 0.8 and for any letter, l, between l=1 (letter A) to l=26 (letter Z), the key center angle is $\Theta(l)=(10l-5)/2\pi$ [rad], and denote touch location by $(r,\theta)$.

(2) For each letter index l, calculate $P^*(l)=\exp(-(\theta-\Theta(l))^2/(1-r)^2)$.

(3) For each l that $P^*(l)>$threshold (=0.1) enter the letter to the letter group. The probability associated with this letter equals to $P(l)=P^*(l)/\Sigma_{k\in l}P^*(k)$.

Using the above calculation, touch point closer to the space key will have more letters in the letter group.

Fox example, the outcome of the above probability calculations are given for four different touch location on area 174a:

(1) $(r,\theta)=(0.8, 10$ deg.$)=>\{(A,0.5), (B,0.5)\}$
(2) $(r,\theta)=(0.6, 25$ deg.$)=>\{(B,0.24), (C,0.52), (D,0.24)\}$
(3) $(r,\theta)=(0.6, 37$ deg.$)=>\{(B,0.18), (D,0.5), (D,0.32)\}$
(4) $(r,\theta)=(0.4, 70$ deg.$)=>\{(E,0.04), (F,0.15), (G,0.31), (H,0.31), (I,0.15)(J,0.04)\}$ Wherein in each letter group the number following the letter indicate the letter probability. Note that in the first example $\theta$ is just in the middle between the letter A and B hence the probability of the letter A and the probability of the letter B are the same but in the case of the second example $\theta$ is just in the middle of the letter C hence the probability of the letter C is maximal. Also note that when r=0.8 only 2 letters are in the letter group while decreasing r to r=0.6 increase the letter group size to 3 letters and further decrease of r to r=0.4 increase the letter group size to 6 letters.

Figure 11:
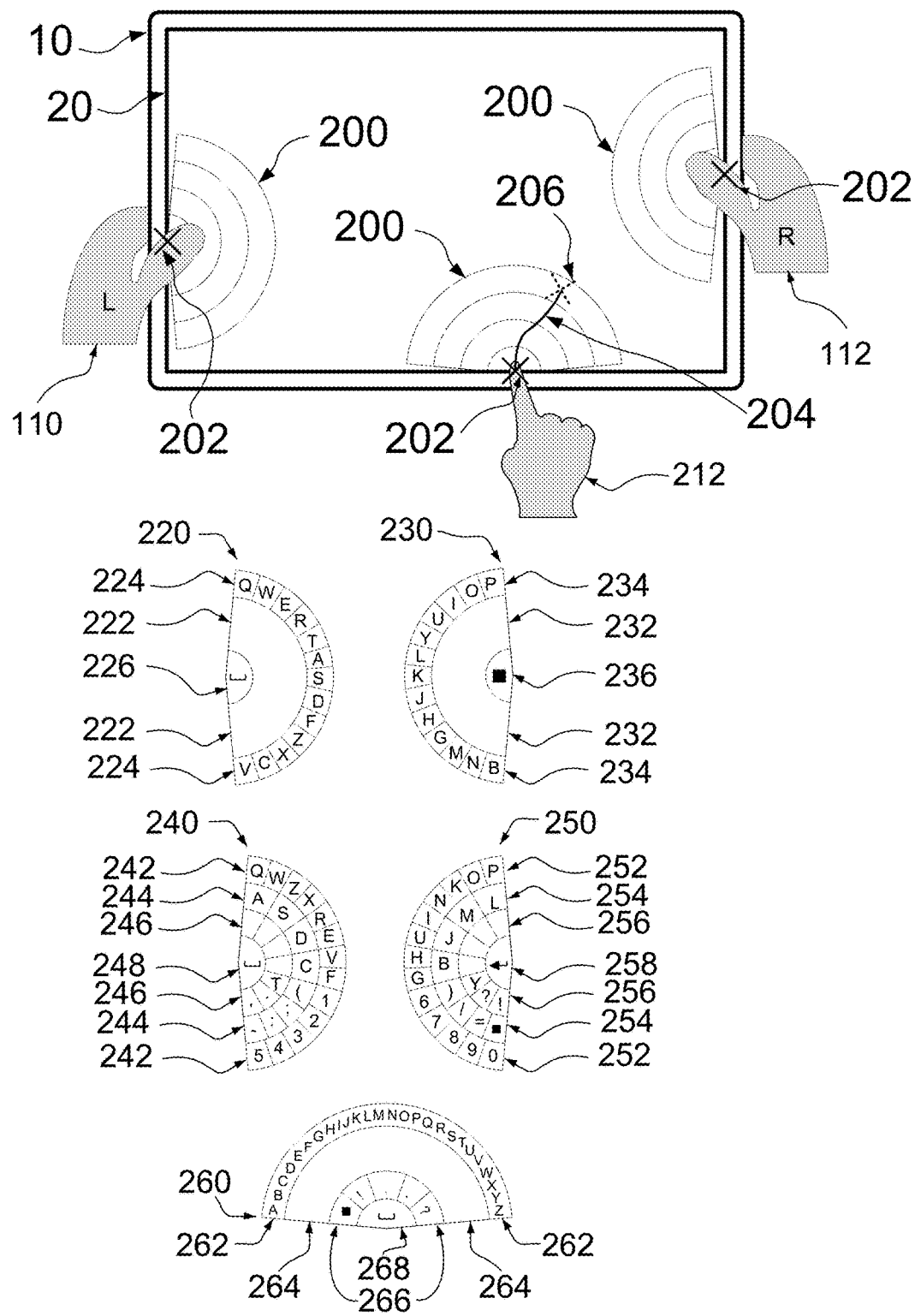
FIG. 11 is a front view and alternative keyboard sections of edge sliding triggered keyboard, in accordance with a preferred embodiment of the present invention.

Reference is now made to FIG. 11. FIG. 11 is keyboard embodiment for smart phones and tablets. Some of the keyboard implementation concepts are based on the embodiment illustrated in FIG. 10.

Electronic device 10, e.g., smart phone or tablet, comprises touch screen 20. Electronic device 10 may be held using both left hand 110 and right hand 112 and operated using the thumbs, or held by one hand and operated by other hand 212, preferably with the index finger. Other operation configurations are possible as well. Keyboard sections 200 are drawn when a finger is sliding from the edge of touch screen 20 inwards. Keyboard section 200 may be in different shapes. In an exemplary embodiment of the invention, a shape of half a cycle or a fan is used as illustrated in the Figure. Keyboard section 200 position on the screen is relative to an anchor 202 that is set to the point where the finger crossed touch screen 20 edge.

Different types of keyboard section 200 may be drawn depending on the actual location of anchor 202 on touch screen 20 edge. For example, different keyboard section 200 may be opened on different touch screen edges (right, left, top bottom). Different type keyboard section 200 may be opened on the same edge as well, for example one keyboard section for the upper part of the left edge and another different keyboard section for the lower part of the left edge. In an exemplary embodiment of the invention, the same keyboard section is opened in different edges. When the same keyboard section is opened in different edges, a proper 90°/180°/270° degree rotation is applied to the keyboard section draw. A ninety degrees corner version keyboard section might be opened if anchor 202 is in proximity to touch screen 20 corners.

If touch screen 20 supports multi-touch detection, several keyboard sections 200 may be operated simultaneously. In case of two thumb operation this means that starting text entry with one thumb may start before the text entry operation with the other thumb is completed.

The actual action taken by the input subsystem depend on the type of keyboard section 200 and gesture 204 that the finger make on touch screen 20 from anchor 202 point until the finger lift up 206. In the following keyboard sections examples the letter entry and action is based only on finger lift up 206 location. However, many variations and/or combinations may be implemented Action based on other gesture properties such as opening additional popup keyboards based on keeping the finger touching a specific location for long time, using other gesture information like the direction of movement before finger lift up, etc.

Keyboard sections 220 and 230 are an exemplary of keyboard section 200 configured to use with both thumbs. Keyboard section 220 is opened when anchor 202 is on the left edge of touch screen 20. A short swipe followed by finger lift up on the area of key 226 enters a space. Longer swipe that reach into area 222 followed by a finger lift-up enters probabilistic letter group entry. The letter probability is calculated in similar fashion as explained in the embodiment illustrated in FIG. 10. If the swipe is even longer and reaches single letter entry ring 224, upon finger lift-up a single letter entry is generated. The selected letter is based on the specific key area that lift-up occurred in.

Keyboard section 230 is opened when anchor 202 is created on the right edge of device 10. A short swipe and finger lift up on the area of key 236 opens a pop up keyboard that configured to enter all additional punctuations, symbols and functions that are generally available in a keyboard. Longer swipe that enter into area 232 enters probabilistic letter group entry with similar processing done in area 222. Even longer swipe that reaches single letter entry ring 234 generates single letter entry.

The 26 roman letters are split between keyboard sections 220 and 230 in a way that the 13 letters in left side of a QWERTY keyboard are assigned to keyboard sections 220 and the 13 letters in right side are assigned to keyboard sections 230. To enter specific letter the thumb need to move longer and in general shorter movements induce faster entry but with higher ambiguity.

Keyboard sections 240 and 250 are another exemplary of keyboard section 200 configured to use with both thumbs. Keyboard section 240 is opened when anchor 202 is on the left edge of touch screen 20 and keyboard section 250 is opened when anchor 202 is created on the right edge of touch screen 20.

A short swipe followed by finger lift up on the area of key 248 enters a space. Outer ring 242 contains 13 keys, 8 of them are single letter entry keys (the letters QWZXREVF) and 5 are digit (12345) keys Inner ring 244 contains 8 keys, 4 of them are single letter entry keys (the letters ASDC) and 4 are punctuation keys (the symbols '(', ';', ':', '-') Inner ring 246 contains 7 keys, 4 of them are letter group entry keys. Another one is a single letter entry key for the letter T and two keys are for period '.' and comma ',' entries.

The group letter keys are configured to have the letters entered in the same angular sector as the letters in the letter group. Fox example the key in ring 244 that is in the same angular sector with keys of the letters Q, W and A is assigned to group letter entry {Q,W,A} and the key in ring 244 that is in the same angular sector with keys of the letters Z, X and S is assigned to group letter entry {Z,X,S}

A short swipe followed by finger lift up on the area of key 258 interprets as activating an enter key. Outer ring 252 contains 13 keys, 8 of them are single letter entry keys (the letters POKNIUHG) and 5 are digit (67890) keys Inner ring 244 contains 8 keys, 4 of them are single letter entry keys (the letters LMJB), 3 are punctuation keys (the symbols ')', '/', '=') and the left most key in the ring 254 is a key that opens a pop up keyboard that configured to enter all additional punctuations, symbols and functions that are generally available in a keyboard Inner ring 256 contains 7 keys, 4 of them are letter group entry keys, one is single letter entry key for the letter Y and two keys are for question mark '?' and exclamation mark '!' entries.

The group letter keys are configured to have the letters entered in the same angular sector as the letters in the letter group. Fox example the key in ring 254 that is in the same angular sector with keys of the letters O, P and L is assigned to group letter entry {O,P,L} and the key in ring 254 that is in the same angular sector with keys of the letters N, K and M is assigned to group letter entry {N,K,M}

Keyboard section 260 is yet another exemplary of keyboard section 200 configured to use with the finger index. Keyboard section 260 is opened when anchor 202 is on the bottom edge of touch screen 20. Alternatively, keyboard section 260 is opened in all anchor 202 locations with a proper rotation. If keyboard section 260 anchor 202 is in the right edge 90° degrees rotation is applied. If keyboard section 260 anchor 202 is in the top edge, 180° degrees rotation is applied and if keyboard section 260 anchor 202 is in the left edge 270° degrees rotation is applied.

The outer ring 262 contains single letter entries for the 26 Roman letters arranged in alphabetical order. If the finger lift up is not in the center of the letter location a group letter entry of the two adjacent letters is provided by the input subsystem Inner ring 264 provides probabilistic group letter entry in a fashion similar to the one described for area 174*a* in FIG. 10. Inner ring 264 contains keys for entering question mark '?', comma ',', period '.', exclamation mark '!' and a key for opening an alternative keyboard. The center key 168 is used for space entry.

As stated previously, the methods to differentiate between single letters and letter group entries on touch screen are varied. The examples teach fine position of finger touch or lift up and swipe direction as a way to differentiate. It is evident that those having skill in the art may use other features like more properties of a gesture or trace on the touch screen, pressure sensing, multi fingers touches, etc.

Figure 12:
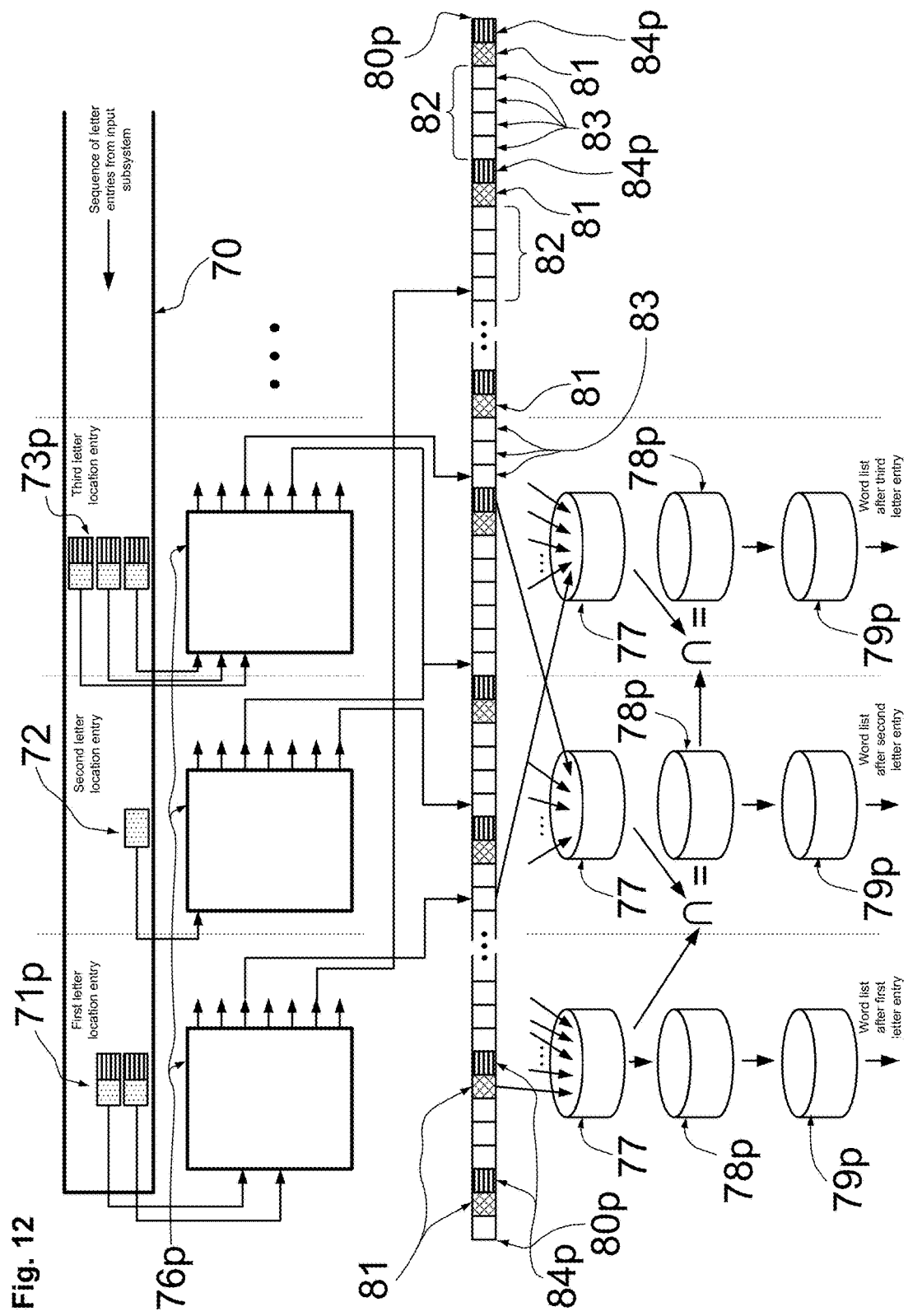
FIG. 12 is a conceptual data structure and data flow of advanced text prediction subsystem that incorporated probabilistic approach to input letters, in accordance with a preferred embodiment of the present invention.

Reference is now made to FIG. 12. FIG. 12 illustrates an exemplary implementation of the modification or upgrades need to be taken in order to process probabilistic letter group entry in text prediction subsystem 92.

Text prediction subsystem 92 receives a sequence of letters entries to letter entry stack 70. As in FIG. 2, letter entry stack 70 contains a letter entry for each letter location entry sent from input subsystem 91. The letter group entries in this illustration are probabilistic and for each letter in the group a letter probability field is attached. In the illustration, first letter location entry 71*p* is group letter entry containing two letters each accompanied by a letter probability. Second letter location entry 72 is single letter entry and third letter location entry 73*p* is group letter entry containing three letters each accompanied by a letter probability.

Data structure 76*p* is used to efficiently search words database 80*p* that contains the letter entry in a specific letter location in the word. In specific, data structure 76*p* can be configured in the same way as data structures 75 and 76 in FIG. 2.

Word database 80*p* that consists of all the words in the language is still stored as a long letter string with end-of-word flags 81 inserted at the end of each word 82. Each word is build from one or more letters 83. An additional field, word frequency field 84*p*, contains information on the a priori frequency of the use of the word in the language. In an exemplary embodiment of the invention, word frequency field 84*p* is updated dynamically based on monitoring the post priori usage of words by the user.

Similar to the way described in the embodiment illustrated in FIG. 2 letter location match bucket 77 is a data structure filled with all the words that match a letter location entry. Each letter location, e.g., first letter location, second letter location, etc., has its own letter location match bucket 77. Word list buckets 78*p* contains a word list that match the accumulated selection done by the letter entry sequence and the processing associated with those buckets is also similar to the one described in the embodiment of FIG. 2. Note that bucket 78 in the non probabilistic case was ordered by the a priori frequency of the words in the language and a maximum length of list optionally was applied. In the probabilistic group letter case, bucket 78*p* may still be ordered but the final order provided to word processing subsystem 93 is dictated by a new processing step or new level of buckets 79*p*. Since buckets 79*p* rearrange the order of the list as will be explained hereinafter the size of bucket 78*p* should be larger, and optionally contain the full possible word list, to compensate reordered done by buckets 79*p*.

Buckets 79*p* contains for each letter entry step an ordered word list wherein the order is taking in consideration not just the a priori frequency of the word but also the probability of the entry of each letter that is provided by the input subsystem. For example, if we refer back to the example given in FIG. 2, and the first letter entry is the letter group of 'C' or 'L' and the second letter entry is single letter entry of the letter 'A', the word list contains the word "can" higher in the list then the word "late". However, if the input subsystem provides a probabilistic group letter entry wherein the probability of the letter 'A' is 90% and the probability of the letter 'L' is only 10% we might want to have the word "late" higher in the list then the word "can".

Lets denote a word in bucket 78*p* in the letter location 1 with $W_i^l$, the word frequency of that word that is taken from field 84*c* of that word with $P_i^l$ and the letter probabilities provided by the input subsystem for the first l letters in $W_i^l$ as $p_l^i$. We can rank each word in bucket 78*p* with the following rank $$R(W_i^l) = (P_i^j)^{c_1} \cdot \prod_1^l (P_j^i)^{c_2}$$

$c_1$ and $c_2$ are weighting coefficient that trade between more weight to the word frequency in database and more weight to the letter probability. Other ways to calculate the final rank for the word may be applied. The order of the word list in bucket 79*p* is based on the words rank from higher to lower. In the case where a length limit is set to word list 96 only the top ranked words will be picked up to the length limit.

It will be appreciated by persons skilled in the art that the presented text prediction data structure and data flow was presented for teaching the invention but it is not limited to what has been particularly shown and described hereinabove rather, the scope of the present invention includes many other data structures and processing methods as well as combinations and sub-combinations of various operations and various methods to provide the word list in accordance with the sequence of the probabilistic version of letter location entries and many more efficient ways in memory size and processing time can be provided.

While this specification contains many specific implementation details, these should not be construed as limitations on the scope of any inventions or of what may be claimed, but rather as descriptions of features specific to particular implementations of particular inventions. Certain features described in this specification in the context of separate implementations may also be implemented in combination in a single implementation. Conversely, various features described in the context of a single implementation may also be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations.

Thus, particular implementations of the invention have been described. Other implementations are within the scope of the following claims. In some cases, the actions recited in the claims may be performed in a different order and still achieve desirable results. In addition, the processes depicted in the accompanying figures do not necessarily require the particular order shown, or sequential order, to achieve desirable results. In certain implementations, multitasking and parallel processing may be advantageous.

The use of data structure and data flow diagrams is not meant to be limiting with respect to the order of operations performed. The herein described subject matter sometimes illustrates different components contained within, or connected with, different other components. It is to be understood that such depicted architectures are merely illustrative, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated may also be viewed as being "operably connected", or "operably coupled", to each other to achieve the desired functionality, and any two components capable of being so associated may also be viewed as being "operably couplable", to each other to achieve the desired functionality.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is expected that during the life of a patent maturing from this application many relevant technologies will be developed and the scope of the terms used is intended to include all such new technologies a priori.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A method of text entry for an electronic device, the method comprising:
   (a) generating a sequence of letter entries from a sequence of keystrokes, wherein for any word a user want to input, a single keystrokes generates a letter entry for a single letter location of the word,
   and wherein the keystrokes performed over a keyboard with a plurality of keys partitioned into multiple regions, at least one region comprising one or more adjacent keys which are activated by a first keystroke and a plurality of second keystrokes, said first keystroke is configured to output a letter group entry which generates a group of possible letters at a letter location of the word and each keystroke from said plurality of second keystrokes is configured to output a single letter entry which generates a single letter to a letter location of a word, and said group of possible letters generated by said first keystroke only comprises letters generated by all said second keystrokes;
   (b) creating a list of possible words, each possible word is a word that is created from a combination of possible letters at each step of said sequence of letter entries that matches with a word in a priori database of words;
   (c) displaying said list of possible words to the user; and
   (d) receiving from the user a selected word in said list of possible words and providing the selected word for further processing.

2. The method of claim 1, wherein the keystrokes in said group of keystrokes are configured to be performed by the user using the same finger.

3. The method of claim 1, wherein said first keystroke is a press on a first key.

4. The method of claim 3, wherein said second keystrokes are tilts on said first key or presses on keys adjacent to said first key.

5. The method of claim 1, wherein said group of keystrokes are performed on a single key and wherein the first keystroke is a non-directional keystroke on this single key and the second keystrokes are directional keystrokes on this single key.

6. The method of claim 1, wherein said letter group entry comprises a probability measure for each letter in the letter group.

7. The method of claim 6, wherein the order of said list of possible words is affected by said probability measure.

8. The method of claim 1, wherein said keyboard comprises at least one key which is defined by a region on a touch surface or a touch screen.

9. The method of claim 8, wherein said first keystroke is a touch on a first key and said second keystrokes are touches on second keys.

10. The method of claim 9, wherein second keys are adjacent to first key.

11. The method of claim 10, wherein said letter group entry comprises a probability measure for each letter in the letter group, and wherein the probability measures are determined by the distance between the position of touch on the first key to each one of the second keys.

12. The method of claim 8, wherein said first keystroke is a touch on a first key and said second keystrokes are swipes to different directions wherein the swipes starts on the first key.

13. The method of claim 9, wherein said keyboard has a circle shape, and wherein a space entry key is located in the center of the circle, the first key is located in an inner ring of the circle and the second keys are in an outer ring of the circle.

14. The method of claim 1, wherein said keyboard is presented on a touch screen whenever a finger or an object are swiped across the touch screen edge, said keys are regions over the touch screen and the keys activation is performed by a keystroke which is a swipe that starts at the edge of the touch screen and ends inside the key region, and first keystroke is performed by using a shorter swipe and second keystrokes are performed by using longer swipes.

15. The method of claim 14, wherein different types of said keyboards are activated conditioned upon at least the side of said touch screen edge that the keystroke was initiated on.

16. A text entry system for an electronic device comprising:
- (a) an input subsystem generating a sequence of letter entries from a sequence of keystrokes, wherein for any word a user want to input, a single keystrokes generates a letter entry for a single letter location of the word,
  the input subsystem comprising a keyboard with a plurality of keys partitioned into multiple regions, at least one region comprising one or more adjacent keys which are activated by a first keystroke and a plurality of second keystrokes, wherein said first keystroke is configured to output a letter group entry which generates a group of possible letters at a letter location of a word and said second keystrokes are configured to output a single letter entry which generates a single letter to a letter location of a word, said group of possible letters generated by said first keystroke only comprises letters generated by all said second keystrokes;
- (b) a text prediction subsystem receiving from the input subsystem the sequence of letter entries and creating a list of possible words, each possible word is a word that is created from a combination of possible letters at each step of said sequence of letter entries that matches with a word in a priori database of words; and
- (c) a word processing subsystem receiving said list of possible words, displaying said list of possible words to the user, receiving from the user a selected word from said list of possible words and providing the selected word for further processing.

17. The text entry system of claim 16, wherein some of said plurality of keys are configured to be the default resting position of multiple fingers and the first keystrokes of said keystrokes groups are presses on these keys.

18. The text entry system of claim 16, wherein said first keystroke is a press on a first key and said second keystrokes are tilts on the first key or presses on keys adjacent to the first key.

19. The text entry system of claim 16, wherein said first keystroke is a press on a first key and said second keystrokes are tilts on the first key.

20. The text entry system of claim 16, wherein said keyboard comprises a touch surface or a touch screen, said keys are regions on the touch surface or the touch screen and said keystrokes are touches or swipes over the touch surface or the touch screen.

21. A method of text entry for an electronic device, the method comprising:
- (a) generating a sequence of letter entries from a sequence of keystrokes, wherein for any word a user want to input, a single keystrokes generates a letter entry for a single letter location of the word,
  and wherein the keystrokes performed over a keyboard with a plurality of keys partitioned into multiple regions, at least one region comprising a first key and a plurality of second keys adjacent to each other,
  a keystroke on said first key is configured to output a letter group entry which generates a group of possible letters at a letter location of a word and each keystroke from said plurality of second keys is configured to output a single letter entry which generates a single letter to a letter location of a word, said group of possible letters generated by said first keystroke only comprising letters generated by keystrokes on all said plurality of second keys;
- (b) creating a list of possible words, each possible word is a word that is created from a combination of possible letters at each step of said sequence of letter entries that matches with a word in a priori database of words;
- (c) displaying said list of possible words to the user; and
- (d) receiving from the user a selected word from said list of possible words and providing the selected word for further processing.

22. The method of claim 21, wherein keys in said group of keys are configured to be activated by the user using the same finger.

23. The method of claim 22, wherein the default resting position of the fingers of the user are said first keys.

* * * * *